United States Patent
Kato

(10) Patent No.: US 7,339,820 B2
(45) Date of Patent: *Mar. 4, 2008

(54) NONVOLATILE MEMORY AND SEMICONDUCTOR DEVICE

(75) Inventor: Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 187 days.

This patent is subject to a terminal disclaimer.

(21) Appl. No.: 10/440,070

(22) Filed: May 15, 2003

(65) Prior Publication Data

US 2003/0202382 A1  Oct. 30, 2003

Related U.S. Application Data

(63) Continuation of application No. 09/844,172, filed on Apr. 25, 2001, now Pat. No. 6,577,531.

(30) Foreign Application Priority Data

Apr. 27, 2000  (JP) ............................ 2000-126773

(51) Int. Cl.
   *G11C 11/34* (2006.01)
(52) U.S. Cl. .......................... 365/185.01; 365/185.05; 365/185.11; 365/185.18
(58) Field of Classification Search ........... 365/185.01, 365/185.05, 185.11, 185.18, 285.29, 185.29
   See application file for complete search history.

(56) References Cited

U.S. PATENT DOCUMENTS

| 4,847,211 A | 7/1989 | Lee |
| 5,648,930 A * | 7/1997 | Randazzo .............. 365/185.07 |
| 5,740,106 A | 4/1998 | Nazarian |
| 5,793,344 A | 8/1998 | Koyama |
| 5,812,450 A | 9/1998 | Sansbury et al. |
| 5,888,868 A | 3/1999 | Yamazaki et al. |
| 6,054,734 A | 4/2000 | Aozasa et al. |

(Continued)

FOREIGN PATENT DOCUMENTS

JP   10-247735   9/1998

(Continued)

OTHER PUBLICATIONS

Johnson, et al., "A 16Kb Electrically Erasable Nonvolatile Memory", Nonvolatile Semiconductor Memories, IEEE ISSCC Dig. Tech. Pap., pp. 152-153, 271, 1980.

*Primary Examiner*—Son Dinh
(74) *Attorney, Agent, or Firm*—Fish & Richardson P.C.

(57) ABSTRACT

A nonvolatile memory capable of acting at each 1 bit and having a high integration density. A small-sized semiconductor device of multiple high functions having such nonvolatile memory.

The nonvolatile memory is constructed to have a memory cell composed of two memory transistors so that it can realize a memory capacity of two times as large for a memory area as that of the full-function EEPROM of the prior art, in which the memory cell is composed of one memory transistor and one selection transistor, while retaining functions similar to those of the EEPROM. On the other hand, the small-sized semiconductor device of high functions or multiple functions is realized by forming the nonvolatile memory of the invention integrally with another semiconductor part over a substrate having an insulating surface.

58 Claims, 16 Drawing Sheets

U.S. PATENT DOCUMENTS

| | | |
|---|---|---|
| 6,157,575 A | 12/2000 | Choi |
| 6,169,307 B1 * | 1/2001 | Takahashi et al. .......... 257/315 |
| 6,198,125 B1 | 3/2001 | Yamazaki et al. |
| 6,272,044 B2 | 8/2001 | Yamamoto et al. |
| 6,472,684 B1 * | 10/2002 | Yamazaki et al. ............ 257/72 |
| 6,667,494 B1 * | 12/2003 | Yamazaki et al. ............ 257/59 |
| 2007/0127290 A1 | 6/2007 | Kato |

FOREIGN PATENT DOCUMENTS

| | | |
|---|---|---|
| JP | 11-156696 | 6/1999 |

* cited by examiner

NONVOLATILE MEMORY AND SEMICONDUCTOR DEVICE

CROSS-REFERENCE TO RELATED APPLICATIONS

This application is a continuation (and claims the benefit of priority under 35 USC 120) of U.S. application Ser. No. 09/844,172, filed Apr. 25, 2001 now U.S. Pat. No. 6,577,531.

BACKGROUND OF THE INVENTION

1. Field of the Invention

The present invention relates to a semiconductor nonvolatile memory and, more particularly, to an electrically erasable and programmable semiconductor nonvolatile memory, e.g., EEPROM (Electrically Erasable and Programmable Read Only Memory). On the other hand, the invention relates to a semiconductor device which is constructed of thin film transistors (as will be called the "TFT") formed by the SOI (Silicon On Insulator) technique. Especially, the invention relates to a semiconductor device in which a semiconductor nonvolatile memory, a pixel portion and a drive circuit for the pixel portion are integrally formed over a substrate having an insulating surface.

Herein, the electrically erasable and programmable read only memory (EEPROM) literally indicates all the electrically erasable and programmable semiconductor nonvolatile memories and contains a full-function EEPROM and a flash memory, for example, under its category. On the other hand, the nonvolatile memory and the semiconductor nonvolatile memory will be used to have the same meaning as that of the EEPROM, unless otherwise specified. Herein, moreover, the semiconductor device indicates all the devices for functioning by utilizing the semiconductor characteristics and contains an electrooptic device represented by a liquid crystal display device or an EL display device, and an electronic device having the electrooptic device mounted thereon, under its category.

2. Description of Related Art

In recent years, there has rapidly spread a small-sized semiconductor device of multiple high functions, as represented by a mobile device such as a mobile computer or a mobile telephone. Accordingly, a semiconductor nonvolatile memory has been noted as a memory composing the semiconductor device. This semiconductor nonvolatile memory is characteristically inferior in the storage capacity but superior in the integration density, the shock resistance, the power consumption and the writing/reading speeds, to a magnetic disk. In recent years, there has been developed a semiconductor nonvolatile memory which has sufficient performances of the number of rewriting operations and the time period for holding the data by solving its intrinsic problems. There has been a trend to employ the semiconductor nonvolatile memory in place of the magnetic disk.

The semiconductor nonvolatile memory is coarsely divided into two classes: the full-function EEPROM and the flash memory. The full-function EEPROM is a semiconductor nonvolatile memory capable of erasing at each 1 bit so that it can perform all the writing, reading and erasing operations at each 1 bit. The EEPROM has higher functions than those of the flash memory but is inferior thereto in the integration degree and the cost. On the other hand, the flash memory is a semiconductor nonvolatile memory for erasing the memory in a batch or at the block unit so that it realizes a high integration density and a low cost while sacrificing the erasure at each 1 bit.

Here is taken up the full-function EEPROM having higher functions as the semiconductor nonvolatile memory of the prior art, to describe the circuit diagram, and the sectional diagram and the driving method of a memory cell.

FIG. 4 is a circuit diagram of the full-function EEPROM of the prior art. In FIG. 4, the full-function EEPROM is constructed to include: a memory cell array 405 having a plurality of memory cells (1, 1) to (n, m) arranged in a matrix shape of an m-number of columns×an n-number of rows; an X-address decoder 401; a Y-address decoder 402; and other peripheral circuits (drive circuits) 403 and 404. The other peripheral circuits include an address buffer circuit, a control logic circuit, a sense amplifier and a booster circuit, which are provided, if necessary.

Each memory cell (as represented by a memory cell (i, j) (i: an integer of 1 or more and n or less, and j: an integer of 1 or more and m or less)) has an n-channel memory transistor Tr1 and an n-channel selection transistor Tr2, which are connected in series. Moreover, the memory transistor Tr1 is connected at its source electrode and control gate electrode with a source line Si and a word line Wj, respectively. The selection transistor Tr2 is connected at its drain electrode and gate electrode with a bit line Bi and a selection line Vj, respectively. On the other hand, bit lines B1 to Bn are connected with the Y-address decoder 402, and word lines W1 to Wm and selection lines V1 to Vm are individually connected with the X-address decoder 401. All source lines S1 to Sn are commonly fed with a predetermined potential Vs.

Where the memory transistors owned by each memory cell are to record data of 1 bit, the full-function EEPROM, as shown in FIG. 4, has a storage capacity of m×n bits.

The data are written, read and erased in one memory cell selected by the X-address decoder 401 and the Y-address decoder 402. Here will be described the writing, reading and erasing operations by taking the memory cell (1, 1) as an example. Here in the specification, the writing operation is to inject electrons into the floating gate electrode of the memory transistor, and the erasing operation is to release the electrons from the floating gate electrode. As a result, the writing operation raises the threshold voltage of the memory transistor, and the erasing operation lowers the threshold voltage.

First of all, where the data are written in the memory transistor Tr1, the source lines S1 to Sn are dropped to a level GND, and a positive high voltage (e.g., 20 V) is applied individually to the bit line B1 and the word line W1. On the other hand, a positive voltage (e.g., 20 V) to turn ON the selection transistor Tr2 is applied to the selection line V1. Under this condition, a high electric field is established to cause an impact ionization in the vicinity of the drain of the memory transistor Tr1. Since the high electric field is also established in the gate direction, moreover, the hot electrons generated are injected into the floating gate electrode so that the writing is effected. The threshold voltage of the memory transistor Tr1 changes depending upon the charge which is stored in the floating gate electrode.

Where the data are to be read from the memory transistor Tr1, the source lines S1 to Sn are dropped to the level GND, and a predetermined voltage (as will be described hereinafter) is applied to the word line W1. On the other hand, a voltage (e.g., 5 V) to turn ON the selection transistor is applied to the selection line V1. According to the threshold voltages of the cases in which the charge is stored and not in the floating gate electrode of the memory transistor Tr1. the data stored in the memory cell are read from the bit line B1.

Here, the predetermined voltage may be set between the threshold voltage in the erased state (in which the electrons are not stored in the floating gate electrode) and the threshold voltage in the written state (in which the electrons are stored in the floating gate electrode). Where the memory transistor in the erased state has a threshold voltage of 2 V or lower and where the memory transistor in the written state has a threshold voltage of 4 V or higher, for example, the predetermined voltage can be exemplified by 3 V.

Where the data stored in the memory transistor Tr1 are to be erased, the source line S1 and the word line W1 are dropped to the level GND, and a positive high voltage (e.g., 20 V) is applied to the bit line B1. On the other hand, a positive high voltage (e.g., 20 V) is applied to the selection line V1 to turn ON the selection transistor Tr2. At this time, a high potential difference is established between the gate-drain of the memory transistor Tr1 so that the electrons stored in the floating gate electrode are released through the tunnel current to the drain region thereby to effect the erasure.

Here, it is assumed that all the signal lines B2 to Bn and W2 to Wm unselected at the writing, reading and erasing times are at 0 V. On the other hand, the above-specified values of the operating voltages are just examples and should not be limited thereto.

For the operations at each 1 bit, when the selected memory cell (1, 1) is written. read and erased, the unselected memory cells (i.e., all the memory cells other than the memory cell (1, 1) in this case) should not be written, read or erased. As a matter of fact, in the memory cells other than the first row, the selection lines V2 to Vn are at 0 V so that the selection transistors are OFF, and the memory transistors are not written or erased while being uninfluenced by the reading time. In the memory cells other than those of the first column, on the other hand, no potential difference is established between the source lines—the bit lines so that the memory cells are not written while being uninfluenced by the reading time. Without the potential difference between the word lines—the bit lines, nor is effected the erasure.

As has been described hereinbefore, the selected memory cell (1, 1) is written, read and erased without causing the malfunctions of the unselected memory cells.

Finally, a representative sectional structure of the memory cells constructing the full-function EEPROM of the prior art is shown in FIG. 5. In FIG. 5, the memory transistor Tr1 (of the n-channel type) and the selection transistor Tr2 (of the n-channel type) are formed over a p-type silicon substrate 500. The memory transistor Tr1 is constructed to include: source/drain regions (or highly doped n-type impurity regions) 501 and 502 and a channel forming region 504 formed in the vicinity of the surface of the silicon substrate 500; and a first gate insulating film 506, a floating gate electrode 508, a second gate insulating film 510 and a control gate electrode 511. The selection transistor Tr2 is constructed to include: source/drain regions (of highly doped n-type impurity regions) 502 and 503 and a channel forming region 505; and a first gate insulating film 507 and a gate electrode 509. Over a layer film 512, on the other hand, there are lead a source wiring line 513 and a drain wiring line 514 through contact holes.

Here in FIG. 5, the drain region 502 and the floating gate electrode 508 of the memory transistor Tr1 overlap partially through the first gate insulating film 506. This overlap region is one for causing the tunnel current to flow in the erasing operation.

It has already been described that the semiconductor nonvolatile memory is divided into the full-function EEPROM and the flash memory. The full-Function EEPROM is a functionally excellent memory capable of acting for each 1 bit. In the full-function EEPROM, however, the memory cell for storing data of 1 bit is constructed of two transistors, i.e., the memory transistor and the selection transistor so that the EEPROM is troubled by a large memory cell area and a low integration density. These troubles obstruct the lower size and the lower cost of the full-function EEPROM.

The flash memory can be said such one mode of the semiconductor nonvolatile memory as can realize a high integration density. The memory cell constructing the flash memory is composed of one memory transistor so that it realizes a high integration density while sacrificing the erasing operation for each 1 bit. In the flash memory, all data have to be erased to rewrite the data of 1 bit. This makes the power consumption higher than that of the full-function EEPROM and lowers the reliability because the memory cells are rewritten although unnecessary. Of course, the flash memory cannot be used for an application requiring the erasure of 1 bit.

SUMMARY OF THE INVENTION

With these being taken into consideration, it can be said that one of the most important targets of the semiconductor nonvolatile memory is to realize the full-function EEPROM of high integration density. This EEPROM is expected for its small size and low cost as a memory which is indispensable for various applications of not only the replacement of the full-function EEPROM of the prior art but also the replacement of the flash memory or a high function.

The invention has been conceived in view of the background thus far described. An object of the invention is to provide a full-function EEPROM which can have a high integration density and accompanying small size and low cost. Another object of the invention is to provide a small-sized semiconductor device of multiple or high functions by forming that semiconductor nonvolatile memory integrally with another part of the semiconductor device composed of TFTs, over a substrate having an insulating surface.

The full-function EEPROM of the prior art is made difficult to realize the high integration density because its memory cell is composed of two transistors, i.e., the memory transistor and the selection transistor. In this case, the cause for obstructing the improvement in the integration density is apparent, because the selection transistor failing to perform the memory function is added to the area of 1 bit.

The flash memory has realized the high integration merely by eliminating that selection transistor. However, the removal of the selection transistor for performing the function to select the memory cell has been compensated by the incomplete operation for each 1 bit. The basic concept of the invention is to add the memory function to the selection transistor so as to realize the high integration. By leaving the function as the selection transistor, there is realized the semiconductor nonvolatile memory which can operate for each 1 bit.

In the invention, the semiconductor nonvolatile memory is constructed of a memory cell composed of two memory transistors. The circuit structure of the memory cell is made such that the selection transistor is replaced by a memory transistor in the full-function EEPROM of the prior art.

The semiconductor nonvolatile memory of the invention is the full-function EEPROM which can act for each 1 bit. On the other hand, both the two transistors composing the memory cell have the memory function so that one memory cell can store data of two times as large as that of the full-function EEPROM of the prior art. Therefore, the semiconductor nonvolatile memory of the invention has a memory capacity of two times as large that for the same memory cell area of the full-function EEPROM of the prior art but has a half memory cell area for 1 bit. As a result, according to the invention, it is possible to provide a full-function EEPROM which has a high integration density and accompanying small size and low cost.

On the other hand, the semiconductor nonvolatile memory of the invention needs no especially new step and has a mask number equal to that of the full-function EEPROM of the prior art. Therefore, it is easy in the technique and cost to change the full-function EEPROM of the prior art to the nonvolatile memory of the invention.

Here, in the invention, the semiconductor nonvolatile memory may be formed over a silicon substrate, over a SOI substrate or over a substrate having an insulating surface.

Especially in the case of the construction of the memory transistor (as will be called the "memory TFT") formed over the substrate having the insulating surface, the semiconductor device having an arbitrary circuit (as represented by a pixel portion and a drive circuit for the pixel portion) composed of the TFTs is enabled to provide a small-sized semiconductor device of multiple high functions by forming the semiconductor nonvolatile memory of the invention integrally as a new memory unit and by assembling the nonvolatile memory in the system.

Here will be enumerated the constructions of the invention.

There is provided a nonvolatile memory comprising: a memory cell array having memory cells arranged in a matrix shape; and a drive circuit for the memory cells, wherein said memory cell has two memory transistors.

There is provided a nonvolatile memory comprising: a memory cell array having memory cells arranged in a matrix; a drive circuit for the memory cells; a plurality of first word lines; a plurality of second word lines; a plurality of bit lines; and a plurality of source lines, wherein said memory cell includes a first memory transistor and a second memory transistor, wherein said first memory transistor and said second memory transistor are connected in series, wherein said first memory transistor is connected at its gate electrode with said first word line, wherein said second memory transistor is connected at its gate electrode with said second word line, wherein said first memory transistor is connected at one of its source electrode and drain electrode with said bit line, and wherein said second memory transistor is connected at the other of its source electrode and drain electrode with said source line.

It is preferable that said nonvolatile memory can be written at each 1 bit and erased at each 1 bit.

It is preferable that said memory cell is written and erased with a tunnel current.

The source line and the bit line, which are to be connected with the memory cell to be written, may be at the same potential at the writing time.

It is preferable:

that each of said first and second memory transistor includes a source region, a drain region, a channel forming region, a first gate insulating film, a floating gate electrode, a second gate insulating film and a control gate electrode; and that in each of said first and second memory transistors, said source region and/or said drain region and said floating gate electrode partially overlap through said first gate insulating film.

Both of the two memory transistors composing said memory cell may be n-channel transistors.

Both of the two memory transistors composing said memory cell may be p-channel transistors.

Said memory cell array and the drive circuit for said memory cell can be integrally formed over a substrate having an insulating surface.

There is provided a semiconductor device comprising: a pixel portion having a plurality of pixels arranged in a matrix shape over a substrate having an insulating surface; a pixel driving circuit composed of TFTs for driving said plurality of pixels; and a nonvolatile memory above-mentioned, wherein said pixel portion, said pixel driving circuit and said nonvolatile memory are integrally formed over said substrate having the insulating surface.

As said semiconductor device, there is provided a liquid crystal display device or an EL display device.

As said semiconductor device, there is provided a display, a video camera, a DVD player, a head-mounted display, a personal computer, a mobile telephone or a car audio.

DESCRIPTION OF THE PREFERRED EMBODIMENTS

Here will be described the circuit diagram and the driving method of a nonvolatile memory and the sectional structure of memory cells of the invention.

Figure 1:
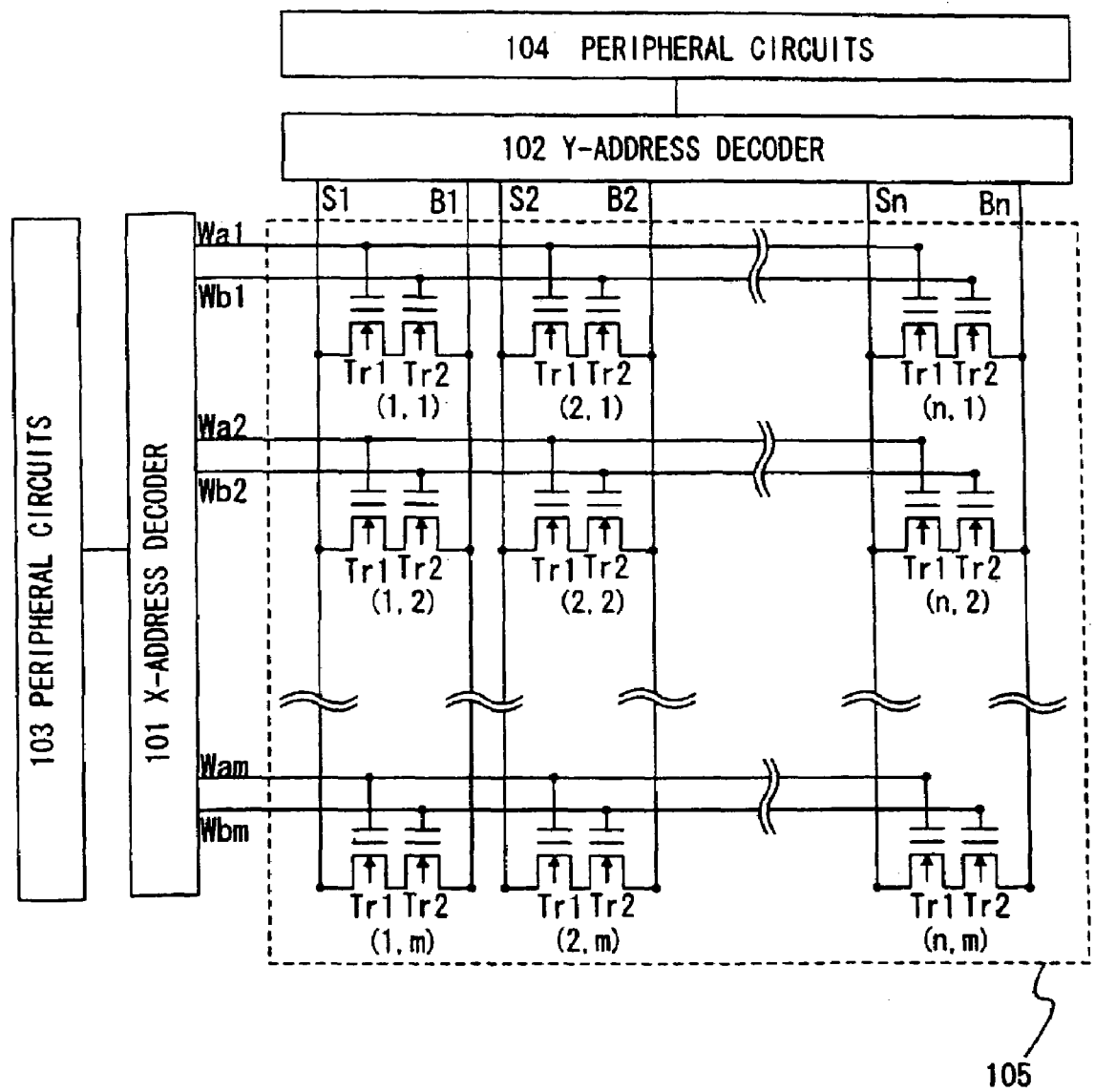
FIG. 1 is a diagram showing a circuit construction of a nonvolatile memory of the invention.

FIG. 1 shows a circuit diagram of a nonvolatile memory of m×n bits of the invention (m and n: integers of 1 or more). The nonvolatile memory of 111 this mode of embodiment is constructed to include: a memory cell array 105 having an m×n number of memory cells (1, 1) to (n, m) arranged in a matrix of longitudinal m and transverse n; an X-address decoder 101 and a Y-address decoder 102 acting as drive circuits for the memory cell array 105; and other peripheral circuits (drive circuits) 103 and 104. On the other hand, each memory cell is composed of two memory transistors Tr1 and Tr2. Where each memory transistor stores data of 1 bit, the nonvolatile memory of this mode of embodiment has a storage capacity of m×n×2 bits. On the other hand, the other peripheral circuits include an address buffer circuit, a control logic circuit, a sense amplifier and a booster circuit, which are provided, if necessary.

Figure 3:
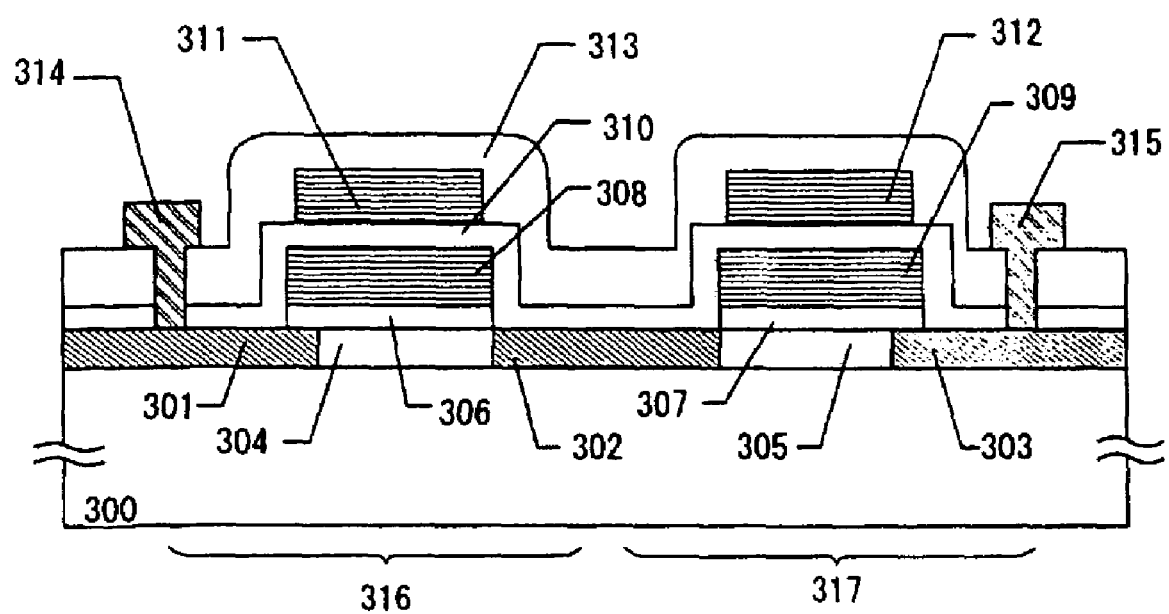
FIG. 3 is a sectional view of the memory cells constructing the nonvolatile memory of the invention.
Figure 4:
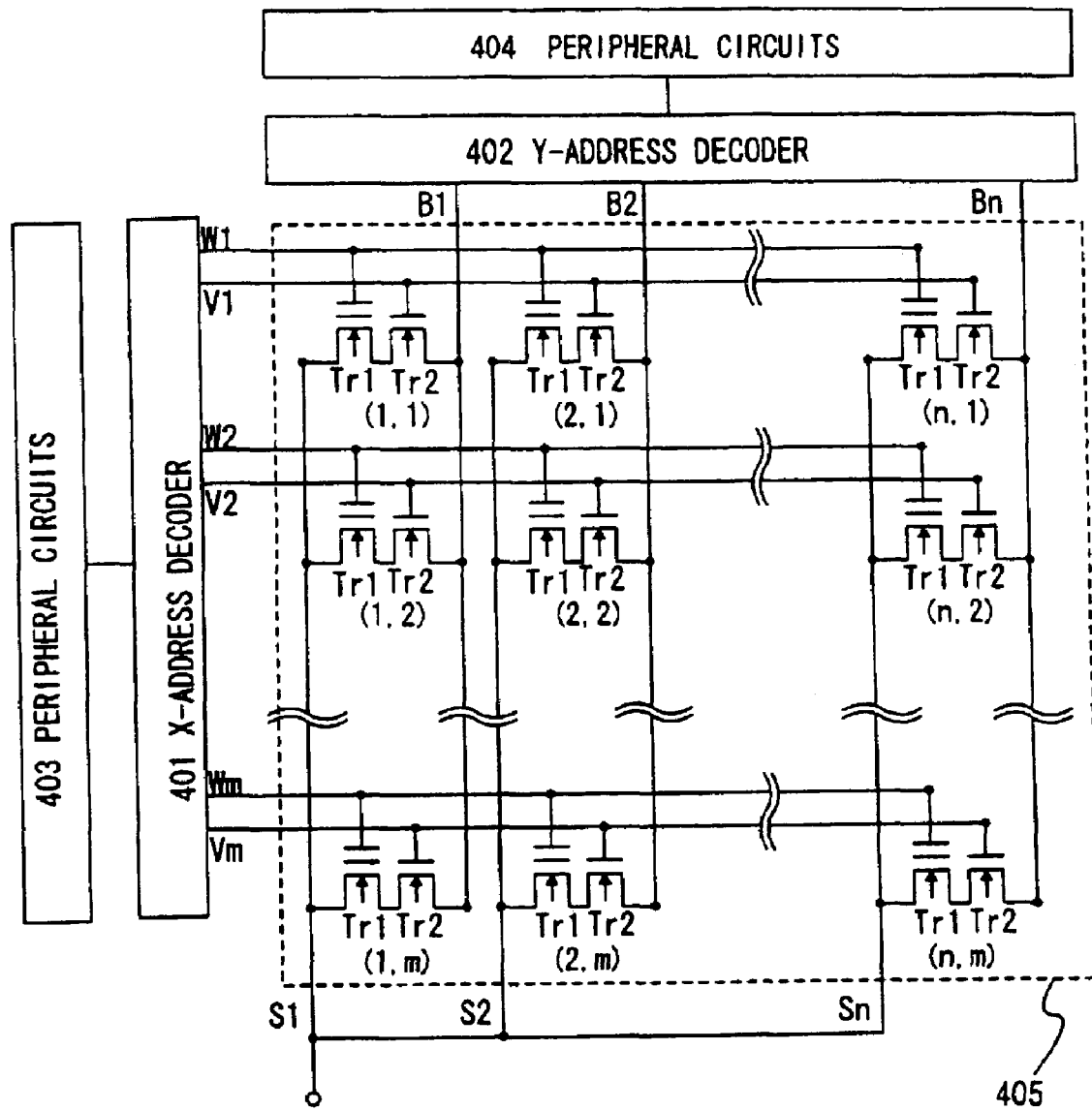
FIG. 4 is a diagram showing of a circuit construction of the nonvolatile memory of the prior art.
Figure 5:
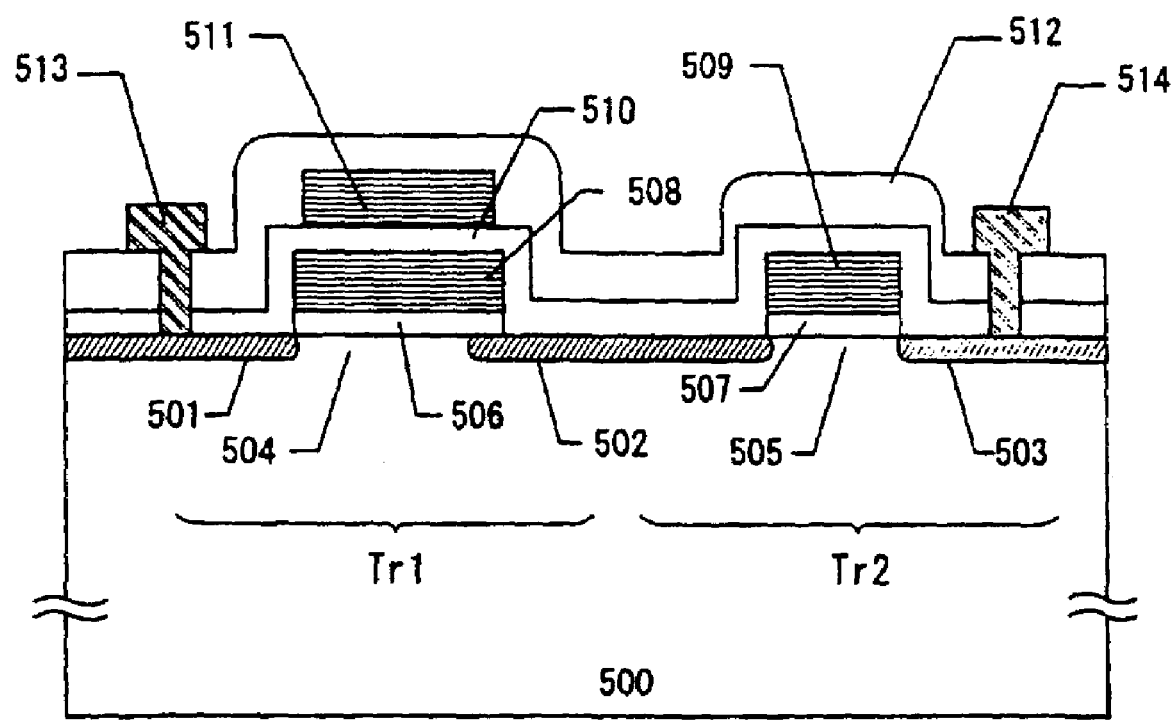
FIG. 5 is a sectional view of the memory cells constructing the nonvolatile memory of the prior art.

The memory transistors Tr1 and Tr2 may be transistors of a conduction type of either n-channel or p-channel but is exemplified in this mode of embodiment by the n-channel transistors (although the p-channel transistors should be referred to FIG. 3). In this mode of embodiment, on the other hand, it is considered that one memory transistor stores data of 1 bit. By the multi-value technique, however, one memory transistor is enabled to store data of 2 bits or more. Where one memory transistor stores data of k bits (where k is an integer of 1 or more), the nonvolatile memory of this mode of embodiment has a storage capacity of m×n×2×k bits.

The memory transistors composing the nonvolatile memory of the invention may be formed over any of a bulk silicon substrate, a SOI substrate and a substrate having an insulating surface. By forming the drive circuits (e.g., the X-address decoder 101 and the Y-address decoder 102 in this mode of embodiment) and other peripheral circuits 103 and 104 over a common substrate, on the other hand, it is possible to realize a small-size nonvolatile memory.

Especially where the nonvolatile memory of the invention is to be constructed of a memory TFT formed over the substrate having the insulating surface, it is enabled to provide a small-sized semiconductor device having multiple high functions (as should be referred to Embodiments 5, 6 and 9) by forming it integrally with the parts of any semiconductor device composed of the TFT.

In FIG. 1, each memory cell (as represented by a memory cell (i, j) (i: an integer of 1 or more and n or less, and j: an integer of 1 or more and m or less)) has the two memory transistors Tr1 and Tr2, which are connected in series. The memory transistor Tr1 is connected at its source electrode and control gate electrode with a source line Si and a first word line Waj, respectively. The memory transistor Tr2 is connected at its drain electrode and control gate electrode with a bit line Bi and a second word line Wbj, respectively. On the other hand, bit lines B1 to Bn and source lines S1 to Sn are individually connected with the Y-address decoder 102, and first word lines Wa1 to Wam and second word lines Wb1 to Wbm are individually connected with the X-address decoder 101.

Here will be described a sectional structure of the memory cells constructing the nonvolatile memory of the invention. FIG. 3 shows one example of the sectional structure of the memory cells which are formed over the substrate having the insulating surface.

In FIG. 3, two memory TFTs 316 and 317 constructing a memory cell are formed over a substrate 300 having an insulating surface. The memory TFT 316 is constructed to include: a semiconductor active layer composed of source/drain regions 301 and 302 and a channel forming region 304; a first gate insulating film 306, a floating gate electrode 308, a second gate insulating film 310 and a control gate electrode 311. The memory TFT 317 is also constructed to include: a semiconductor active layer composed of source/drain regions 302 and 303 and a channel forming region 305; a first gate insulating film 307, a floating gate electrode 309, a second gate insulating film 310 and a control gate electrode 312. Over a layer film 313, on the other hand. there are led a source electrode 314 and a drain electrode 315 through contact holes.

On the other hand, the memory TFT 316 has a region, in which the source region 301 and the floating gate electrode 308 overlap partially through the first gate insulating film 306, and the memory TFT 317 has a region, in which the source region 303 and the floating gate electrode 309 overlap partially through the first gate insulating film 307. This region (as will be called the "overlap region") is one for a tunnel current to flow between the floating gate electrode—the source/drain regions. The location of the overlap region has a relation to the operating method of the nonvolatile memory.

The nonvolatile memory of the invention is characterized by using the memory transistors having a memory function as selection transistors, as compared with the full-function EEPROM of the prior art. This use enables the nonvolatile memory of the invention to store the data of 2 bits for one memory cell and the data to be written, read and erased completely at the unit of 1 bit.

In this case, especially in the writing operation, there is used a driving method which is different from the full-function EEPROM of the prior art. Specifically, the writing is performed with the tunnel current in place of the hot electron injection. At this time, the source line is desirably connected with the Y-address decoder like the bit line so that it can apply not a common potential but a selective potential. By taking the memory cell (1, 1) as an example, here will be described the description of the writing, reading and erasing methods respectively in the memory transistors Tr1 and Tr2.

First of all, where data are to be written in the memory transistor Tr1: the source line S1 and the bit line B1 are set at −10 V; the first word line Wa1 is set at 10 V; and the second word line Wb1 is set at 0 V. As a result, the memory transistor Tr1 is turned ON so that a high potential difference is established between the control gate electrode—the channel region. Moreover, electrons are injected by the tunnel current from the channel region into the floating gate thereby to effect the writing. On the other hand, the second word line Wb1 has to suppress the potential difference (as may also be called the "stress") among the control gate electrode, the source electrode and the drain electrode of the memory transistor Tr2 at such a low value that the memory transistor Tr2 may not be erroneously written.

The memory transistor Tr2 can be written like the memory transistor Tr1. For example, it is sufficient to set the source line S1 and the bit line B1 at −10 V, the first word line Wa1 at 0 V and the second word line Wb1 at 10 V. As a result, a high potential difference is established between the control gate electrode—the drain electrode of the memory transistor Tr2 so that the injection of electrons (i.e., the writing) of the floating gate is caused by the tunnel current.

On the other hand, a stress at about 10 V at the highest is applied to the memory transistor Tr1 so that no writing is caused.

On the other hand, the stress in the memory cells (as may also be called the "unselected memory cells") other than the memory cell (1, 1) is also at about 10 V at the highest so that the writing is not caused either.

Here will be described the reading operation. Where the data stored in the memory transistor Tr1 are to be read: the source line S1 is fed with 0 V; the first word line Wa1 is fed with a (later-described) predetermined voltage; and the second word line Wb1 is fed with such a voltage (e.g., 8 V) as will turn ON the memory transistor Tr2, for example. As a result, the (ON or OFF) state of the memory transistor Tr1 is determined according to the threshold voltage, and the (conductive or inconductive) state between the source line S1—the bit line B1 is determined, so that the data stored in the memory transistor Tr1 can be read from the bit line B1.

Here, the predetermined voltage may be set between the threshold voltage in the erased state (in which no electron is stored in the floating gate electrode) and the threshold voltage in the written state (in which electrons are stored in the floating gate electrode). Where the memory transistor in the erased state has a threshold voltage of −1 V to 2 V and where the memory transistor in the written state has a threshold voltage of 4 V to 7 V, for example, the predetermined voltage can be exemplified by 3 V.

The operations are similar where the data stored in the memory transistor Tr2 are to be read. It is then sufficient to set the source line S1 at 0 V, the first word line Wa1 at a voltage (e.g., 8 V) to turn ON the memory transistor Tr2, and the second word line Wb1 at the aforementioned predetermined voltage (e.g., 3 V).

Here, all the unselected memory cells (1, 2) to (1, m) in the same column as that of the selected memory cell (1, 1) have to be in the inconductive state. In other words. the memory transistor Tr1 or Tr2 has to be OFF. Especially where the threshold value distribution extends so far as to 0 V or lower, a malfunction may be caused by the aforementioned operating voltage. This problem can be eliminated by several methods. Where the distribution of the threshold voltage of the memory transistor in the erased state is over −5 V, for example, all the unselected memory transistors are turned OFF to cause no malfunction, by setting the source line S1 of the memory transistor Tr1 to be read at 5 V, the first word line Wa1 at 8 V and the second word line Wb1 at 13 V. In addition, the malfunction at the reading time can also be eliminated by a method, in which the distribution of the threshold voltage in the erased state is controlled to over 0 V by providing a verify circuit as the peripheral circuit, or a method in which a memory element is given a split gate structure.

The data erasure will be lastly described. The erasing operation uses the tunnel current in the direction reversed from that of the writing operation. The memory transistor Tr1 is erased by setting the source line S1 and the bit line B1 at 10 V, the first word line Wa1 at −10 V and the second word line Wb1 at 0 V, for example. At this time, the memory transistor Tr1 is turned OFF so that a high potential difference is established between the control gate electrode—the source electrode. As a result, the tunnel current flows in the overlap region between the control gate electrode and the source electrode so that the electrons are released from the floating gate to the source region. In short, the erasure is made.

The operations are similar where the memory transistor Tr2 is to be erased. It is then sufficient to set the source line S1 and the bit line B1 at 10 V, the first word line Wa1 at 0 V and the second word line Wb1 at −10 V, for example.

On the other hand, the unselected memory cells have a stress of about 10 V at the highest so that they are not erroneously erased.

Here, in the foregoing operating methods, all the bit lines B2 to Bn, the source lines S2 to Sn, the first word lines Wa2 to Wam and the second word lines Wb2 to Wbm, as unselected at the writing time and the at the reading time, have the potential of 0 V.

Thus, the nonvolatile memory of the invention not only can store the data of 2 bits for one memory cell but also can write, read and erase the data completely at the unit of 1 bit. The nonvolatile memory of the invention is a full-function EEPROM. Moreover, this EEPROM realizes an integration density of two times as high as that of the full-function EEPROM of the prior art, which is composed of one memory transistor and one selection transistor.

Of course, the above-specified values of the operating voltages are just examples and should not be limited thereto. As a matter of fact, the voltages to be applied to the memory transistors depend upon the first gate insulating film, the second gate insulating film, the capacity between the control gate electrode and the floating gate electrode, the size of the overlap region and so on. Moreover, the operating voltage of the memory transistors vary accordingly.

The values of the operating voltages may be any so long as they are within a range to cause no malfunction in the unselected memory cells while holding the potential differences necessary for performing the writing, reading and erasing operations in the selected memory cells.

Here, in the operating method of this mode of embodiment, the circuit structure is made such that the source lines are not fed with a common potential but connected with the drive circuit (i.e., the Y-address decoder in this mode of embodiment) so that they are selectively fed with the potentials as in the bit lines. With this circuit structure, the operating method can retain a wide operation margin although the peripheral circuit area is defectively increased more or less. On the other hand, the full-function EEPROM of the prior art is troubled by an increased power consumption or an augmented load on the circuit because the high potential difference occurs between the source and the drain at the erasing time. Since the source line and the bit line are at the same potential at the erasing time, according to the driving method of this mode of embodiment, the electric current, as might otherwise be caused by the potential difference between the source and the drain, will not flow thereby to cause such troubles.

The nonvolatile memory of the invention can erase and write a plurality of memory transistors simultaneously. Especially, the memory transistors of one memory cell (composed of two memory transistors) and at the unit of one column, one row, a plurality of columns, a plurality of rows and all memory cells can be simultaneously erased and written. Where the two memory transistors Tr1 and Tr2 of one memory cell (1, 1) are to be simultaneously written, for example, it is sufficient to set the source line S1 and the bit line B1 at −10 V and the first word line Wa1 and the second word line Wb1 at 10 V. In the case of the simultaneous erasures, on the other hand, it is sufficient to set the source line S1 and the bit line B1 at 10 V and the first word line Wa1 and the second word line Wb1 at −10 V.

Embodiment 1

In this embodiment, the nonvolatile memory of the invention is exemplified by constructing it of p-channel memory transistors. The circuit diagram and the driving method will be described by taking a nonvolatile memory of 2,048 bits.

Figure 6:
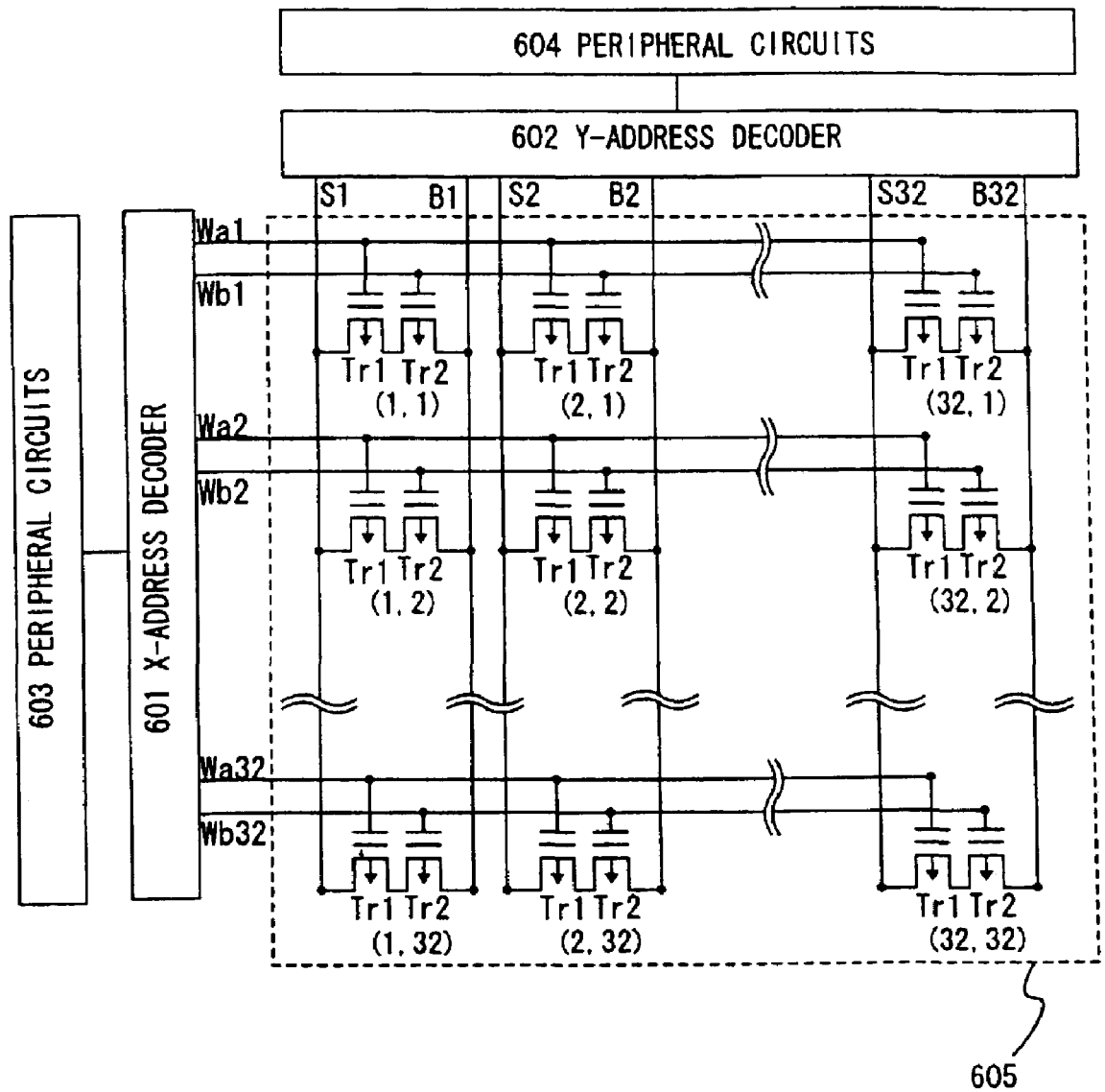
FIG. 6 is a diagram showing a circuit construction of the nonvolatile memory of the invention.

FIG. 6 shows a circuit diagram of the nonvolatile memory of this embodiment. The nonvolatile memory shown in FIG. 6 is constructed to include: a memory cell array 605 having 1,024 memory cells (1, 1) to (32, 32) arranged in a matrix of 32 columns and 32 rows; an X-address decoder 601; a Y-address decoder 602; and other peripheral circuits (drive circuits) 603 and 604. Each memory cell is composed of two p-channel memory transistors Tr1 and Tr2. Where each memory transistor stores data of 1 bit, the nonvolatile memory of this embodiment has a storage capacity of 2,048 bits. On the other hand, the other peripheral circuits include an address buffer circuit, a control logic circuit, a sense amplifier and a booster circuit, which are provided, if necessary.

Each memory cell (as represented by a memory cell (i, j) (i and j: integers of 1 or more and 32 or less)) has the two memory transistors Tr1 and Tr2, which are connected in series. The memory transistor Tr1 is connected at its source electrode and control gate electrode with a source line Si and a first word line Waj, respectively. The memory transistor Tr2 is connected at its drain electrode and control gate electrode with a bit line Bi and a second word line Wbj, respectively. On the other hand, bit lines B1 to B32 and source lines S1 to S32 are individually connected with the Y-address decoder 602, and first word lines Wa1 to Wa32 and second word lines Wb1 to Wb32 are individually connected with the X-address decoder 601.

The nonvolatile memory of this embodiment not only can store data of 2 bits for each memory cell but also can write, read and erase the data completely at the unit of 1 bit. The operating method performs the writing and the erasure with the tunnel current, like the operating method of the n-channel nonvolatile memory which has been described in the mode of embodiment. Here will be briefly described the method of operating the p-channel nonvolatile memory.

The writing operation and the erasing operation can use the same operating voltage as that of the embodiment. Where the memory transistor Tr1 in the memory cell (1, 1) is to be erased, for example, it is sufficient to set the source line S1 and the bit line B1 at 10 V, the first word line Wa1 at −10 V and the second word line Wb1 at 0 V. Where the memory transistor Tr1 in the memory cell (1, 1) is to be written, on the other hand, it is sufficient to set the source line S1 and the bit line B1 at −10 V, the first word line Wa1 at 10 V and the second word line Wb1 at 0 V. Where the memory transistor Tr2 is to be written and erased, it is sufficient to interchange the potential of the first word line and the potential of the second word line. On the other hand, the stress in the unselected memory cells is at about 10 V at the highest at the writing and erasing times so that the erroneous writing and erasing operations are not performed.

At the writing and erasing times, the p-channel memory transistor comes into the state (ON or OFF) reversed from that of the n-channel memory transistor. In short, in the p-channel, the memory transistor to be written is turned OFF, and the memory transistor to be erased is turned ON. As a result, the erasing operation is performed by the tunnel current to flow through the channel region, and the writing operation is performed by the tunnel current to flow through the overlap region between the control gate electrode and the source/drain electrode. Where the aforementioned operating voltage is used, the tunnel electrode at the writing time flows either between the floating gate electrode—the source region of the memory transistor Tr1 or between the floating gate electrode—the drain region of the memory transistor Tr2. Therefore, the overlap region has to be formed between the floating gate electrode—the source region of the memory transistor Tr1 and between the floating gate electrode—the drain region of the memory transistor Tr2.

The reading operations will be described by taking the memory cell (1, 1) as an example. Where the data stored in the memory transistor Tr1 are to be read: the source line S1 is fed with 0 V; the first word line Wa1 is fed with a (later-described) predetermined voltage; and the second word line Wb1 is fed with such a voltage (e.g., −5 V) as will turn ON the memory transistor Tr2, for example. As a result, the (ON or OFF) state of the memory transistor Tr1 is determined according to the threshold voltage of the memory transistor Tr1, and the (conductive or inconductive) state between the source line S1—the bit line B1 is determined, so that the data stored in the memory transistor Tr1 can be read from the bit line B1.

Here, the predetermined voltage may be set between the threshold voltage in the erased state (in which no electron is stored in the floating gate electrode) and the threshold voltage in the written state (in which electrons are stored in the floating gate electrode). Where the memory transistor in the erased state has a threshold voltage of −4 V to −1 V and where the memory transistor in the written state has a threshold voltage of 1 V to 4 V, for example, the predetermined voltage can be exemplified by 0 V.

The operations are similar where the data stored in the memory transistor Tr2 are to be read. It is then sufficient to set the source line S1 at 0 V, the first word line Wa1 at a voltage (e.g., −5 V) to turn ON the memory transistor Tr2, and the second word line Wb1 at the aforementioned predetermined voltage (e.g., 0 V).

Here, all the unselected memory cells (1, 2) to (1, 32) in the same column as that of the selected memory cell (1, 1) have to be in the inconductive state. If the aforementioned distribution of the threshold voltage is assumed, the threshold voltage of the memory transistor in the written state is at 0 V or higher so that the memory cell having the memory transistor comes into the conductive state to cause the malfunction. The method for suppressing this malfunction may be made, in the case of the memory transistor Tr1 to be read, by setting the source line S1 at −5 V, the first word line Wa1 at −5 V and the second word line Wb1 at −10 V, for example. In this case, the malfunction does not occur if the memory transistor Tr1 or Tr2 is at 5 V or lower. In addition, the malfunction at the reading time can also be suppressed by providing a verify circuit as the peripheral circuit or by making the memory element into the split gate structure.

Here, it is assumed that all the potentials of the bit lines B2 to B32, the source lines S2 to Sn, the first word lines Wa2 to Wa32 and the second word lines Wb2 to Wb32, as left unselected in the aforementioned operating method, are at 0 V.

Of course, the above-specified values of the operating voltages are just examples and should not be limited thereto. The values of the operating voltages may be any so long as they are within a range to cause no malfunction in the unselected memory cells while holding the potential differences necessary for performing the writing, reading and erasing operations in the selected memory cells.

On the other hand, the nonvolatile memory of the invention can erase and write a plurality of memory transistors simultaneously. For example, the memory transistors of one memory cell (composed of two memory transistors) and at the unit of one column, one row, a plurality of columns, a plurality of rows and all memory cells can be simultaneously erased and written. Where the two memory transistors Tr1 and Tr2 of one memory cell (1, 1) are to be simultaneously written, for example, it is sufficient to set the source line S1 and the bit line B1 at −10 V and the first word line Wa1 and the second word line Wb1 at 10 V. In the case of the simultaneous erasures, on the other hand, it is sufficient to set the source line S1 and the bit line B1 at 10 V and the first word line Wa1 and the second word line Wb1 at −10 V.

Embodiment 2

In this embodiment, here will be described the nonvolatile memory of the invention will be described the memory cell circuit diagram and the driving method which are different from those of the mode of embodiment and Embodiment 1.

Figure 7A:
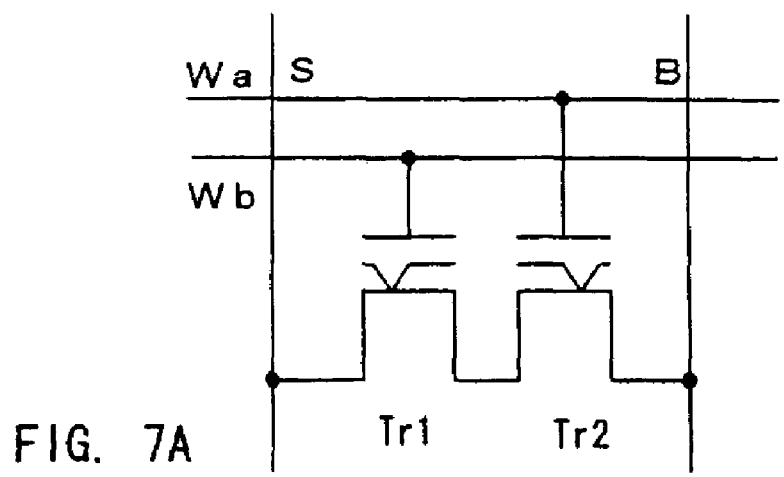
FIGS. 7A to 7C are circuit diagrams of memory cells constructing the nonvolatile memory of the invention.
Figure 7B:
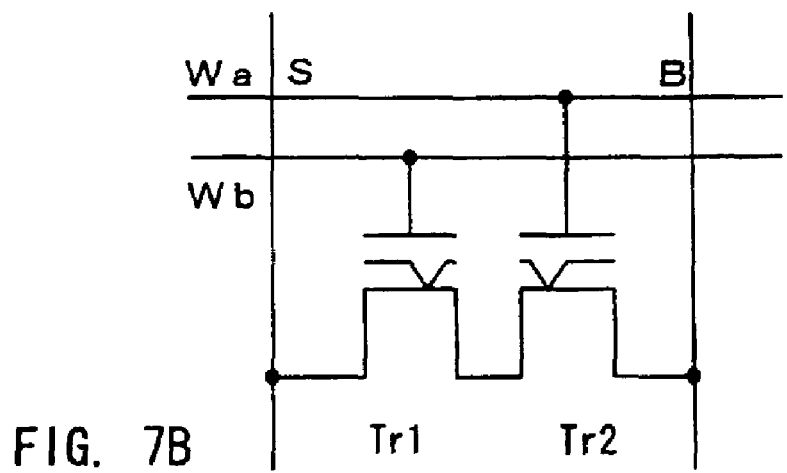
Figure 7C:
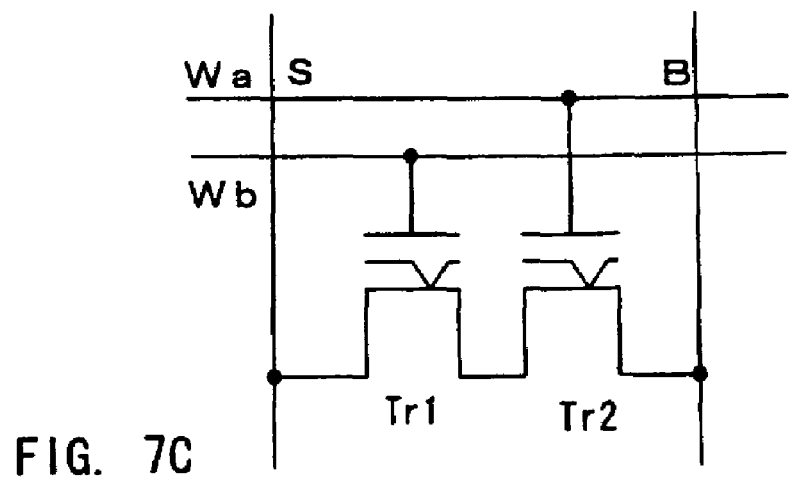

FIGS. 7A to 7C are circuit diagrams of memory cells composing the nonvolatile memory of the invention. In FIGS. 7A to 7C, the recesses of the floating gate electrodes illustrate the overlap regions. In FIG. 7A, for example, the overlap region of the memory transistor Tr1 is formed between the floating gate electrode—the source region, and the overlap region of the memory transistor Tr2 is formed between the floating gate electrode—the drain region. In FIG. 7B, for example, the overlap region of the memory transistor Tr1 is formed between the floating gate electrode—the drain region, and the overlap region of the memory transistor Tr2 is formed between the floating gate electrode—the source region. In FIG. 7C, both the overlap region of the memory transistor Tr1 and the overlap region of the memory transistor Tr2 are formed between the floating gate electrode—the drain region. Here, the memory cells constructing the nonvolatile memory, as has been described in the mode of embodiment and Example 1, have the structure of FIG. 7A.

In this embodiment, here will be described the nonvolatile memory having the memory cell structures, as shown in FIGS. 7B and 7C, and their driving method. What is different among the three memory cells shown in FIGS. 7A to 7C is the locations of the overlap regions. Therefore, the reading operation, the writing operation of the n-channel nonvolatile memory and the erasing operation of the p-channel nonvolatile memory can use the same operating methods as those of the mode of embodiment and Embodiment 1. For the erasing operation of the n-channel nonvolatile memory and the writing operation of the p-channel nonvolatile memory, for example, the following operating voltages can be used according to the locations of the overlap regions.

First of all, here will be described the circuit diagram of the memory cell shown in FIG. 7B. For the erasing operation of the memory transistor Tr2 in the n-channel nonvolatile memory, for example, it is sufficient to set the source line S at 5 V, the bit line B at 0 V, the first word line Wa at 13 V, and the second word line Wb at −15 V. As a result, the tunnel current flows into the overlap region of the memory transistor Tr2 so that the electrons stored in the floating gate electrode are released into the source region. Where the memory transistor Tr1 is to be erased, on the other hand, it is sufficient to set the source line S at 0 V, the bit line B at 5 V, the first word line Wa at 15 V, and the second word line Wb at 13 V.

At this time, the unselected memory cells in the same column as that of the selected memory cell have to be inconductive because the potential difference is established between the source line—the bit line. Where the above-specified operating voltages are used, it is necessary that the threshold voltage of the memory transistor Tr1 or Tr2 be at 0 V or higher. In order suppress the conductions of the unselected memory cells, It is sufficient for writing the memory transistor Tr2 to set the source line S at 7 V, the bit line B at 2 V, the first word line Wa at 15 V and the second word line Wb at −13 V, for example. If the threshold voltage of the memory transistor Tr1 or Tr2 is at −2 V or higher in this case, the unselected memory cells are not rendered conductive. Here, the conductions of the unselected memory cells can also be suppressed by providing a verify circuit as the peripheral circuit or by making the memory element into the split gate structure.

For the writing operation of the memory transistor Tr2 in the p-channel nonvolatile memory, for example, it is sufficient to set the source line S at −5 V, the bit line B at 0 V, the first word line Wa at −10 V and the second word line Wb at 15 V. As a result, the tunnel current flows into the overlap region of the memory transistor Tr2 so that the electrons are injected from the source region into the floating gate electrode. Where the memory transistor Tr1 is to be written, on the other hand, it is sufficient to set the source line S at 0 V, the bit line B at −5 V, the first word line Wa at 15 V and the second word line Wb at −10 V.

Here, the unselected memory cells in the same column as that of the selected memory cell have to be inconductive because the potential difference is established between the source line—the bit line. Where the above-specified operating voltages are used, it is necessary that the threshold voltage of the memory transistor Tr1 or Tr2 be at 0 V or lower. In order suppress the conductions of the unselected memory cells, It is sufficient for writing the memory transistor Tr2 to set the source line S at −10 V. the bit line B at −5 V, the first word line Wa at −15 V and the second word line Wb at 10 V, for example. If the threshold voltage of the memory transistor Tr1 or Tr2 is at 5 V or lower in this case, the unselected memory cells are not rendered conductive. Here, the conductions of the unselected memory cells can also be suppressed by providing a verify circuit as the peripheral circuit or by making the memory element into the split gate structure.

Here will be described the circuit diagram of the memory cell of FIG. 7C. In the circuit diagram of the memory cell of FIG. 7C, the overlap regions of both the memory transistors Tr1 and Tr2 are formed between the floating gate electrode—the drain region.

The writing and erasing operations of the nonvolatile memory having the circuit diagram of the memory cell of FIG. 7C may be performed by combining the operating method of the memory transistor Tr2 in the memory cell of FIG. 7A and the operating method of the memory transistor Tr1 in the memory cell of FIG. 7B. Where the memory transistor Tr1 is to be erased in the n-channel nonvolatile memory, more specifically, it is sufficient to set the source line S at 0 V, the bit line B at 5 V, the first word line Wa at −15 V and the second word line Wb at 13 V, as in FIG. 7B. Where the memory transistor Tr2 is to be erased, on the other hand, it is sufficient to set the source line S and the bit line B at 10 V, the first word line Wa at 0 V and the second word line Wb at −10 V, as in FIG. 7A. Where the memory transistor Tr1 is to be written in the n-channel nonvolatile memory, on the other hand, it is sufficient to set the source line S at 0 V, the bit line B at −5 V, the first word line Wa at 15 V and the second word line Wb at −10 V, as in FIG. 7B. Where the memory transistor Tr2 is to be written, on the other hand, it is sufficient to set the source line S and the bit line B at −10 V, the first word line Wa at 0 V and the second word line Wb at 10 V, as in FIG. 7A.

With the circuit construction of the memory cell shown in FIG. 7C, it is possible to suppress the dispersion of the size of the overlap region due to a misalignment. With the circuit construction of the memory cell of FIG. 7A or 7B, however, the misalignment, if any, at the step of forming the overlap region makes different the overlap region of the memory transistor Tr1 and the overlap region of the memory transistor Tr2. As a result, there arises a problem that the dispersions are made in the wiring rate and the erasing rate. This problem is avoided in the circuit construction of the memory cell shown in FIG. 7C.

In both the memory transistors Tr1 and Tr2, although not shown, the memory cells having the overlap regions formed between the floating gate electrode—the source region can also be written and erased by combining the operating methods of the memory cells of FIGS. 7A and 7B.

On the other hand, the overlap region may be formed on the two sides, i.e., on the source region side and on the drain region side. In this case, it is possible to combine the operating methods of FIGS. 7A and 7B freely. By forming the overlap regions on the two sides, the tunnel current to flow in one overlap region can be reduced to suppress the deterioration of the memory transistors due to the tunnel current.

On the other hand, it is not necessary to form the overlap region positively. In this case, the writing operation and the erasing operation at a higher voltage are necessary that of the case in which the tunnel current flows in the overlap region.

Of course, the above-specified values of the operating voltages are just examples and should not be limited thereto. The values of the operating voltages may be any so long as they are within a range to cause no malfunction in the unselected memory cells while holding the potential differences necessary for performing the writing, reading and erasing operations in the selected memory cells.

Embodiment 3

Figure 2:
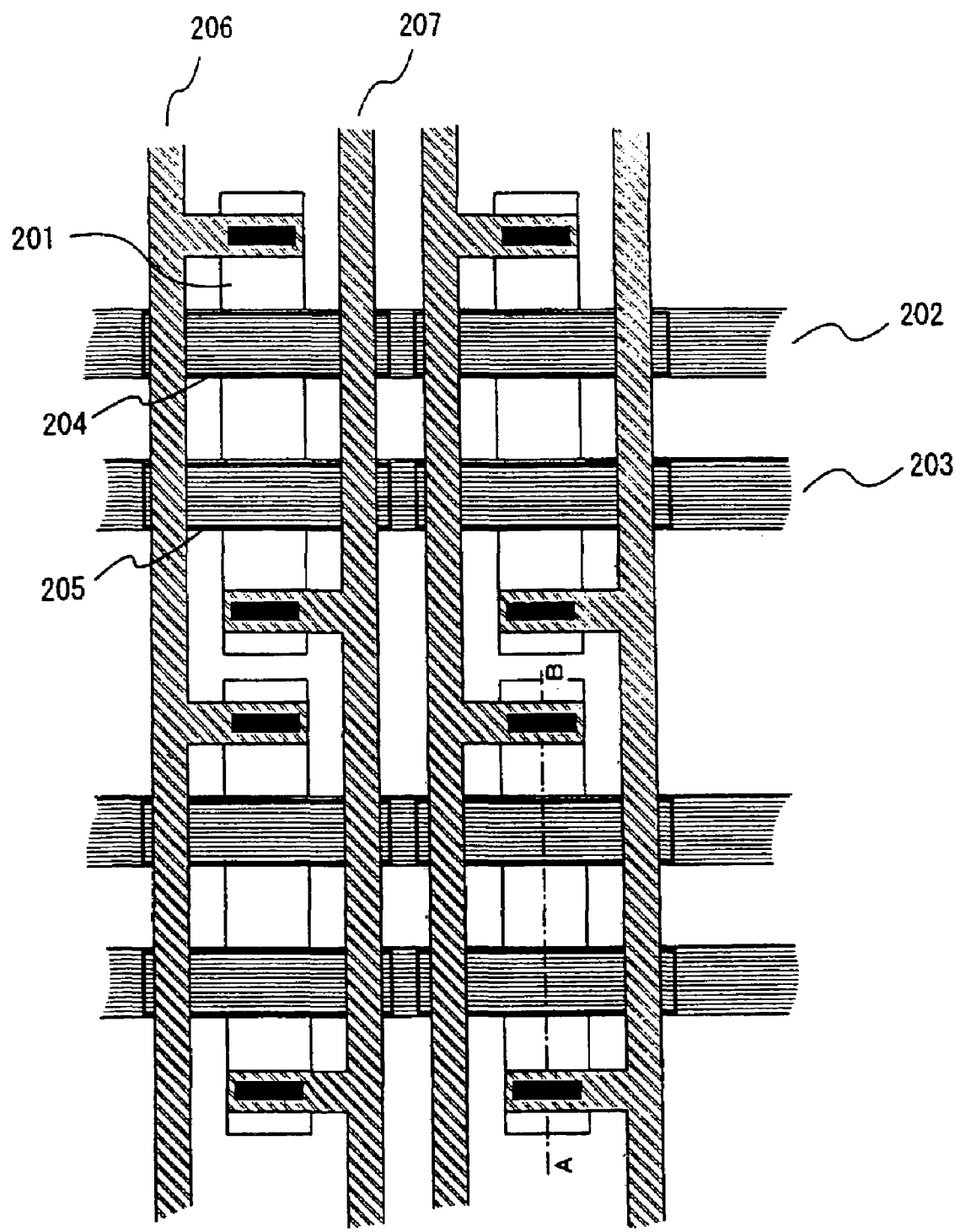
FIG. 2 is a top plan view of memory cells constructing the nonvolatile memory of the invention.

This embodiment will be described on the upper face structure of the memory cells constructing the nonvolatile memory of the invention. FIG. 2 presents one example of the upper face diagram of four memory cells, and can be thought to show one portion of the memory cell array constructing the nonvolatile memory, as has been described in connection with the mode of embodiment and Embodiments 1 and 2, for example.

Here will be described only the lefthand upper memory cell. First of all, a region 201 is a semiconductor active region. This semiconductor active region indicates a semiconductor active region to be formed over the silicon substrate and a semiconductor active layer formed either over the substrate having the insulating surface or over the SOI substrate. Regions 204 and 205 are floating gate electrodes, and word lines 206 and 207 are a source line and a bit line, respectively. In FIG. 2, solid portions indicate the contacts with the underlying wiring line or semiconductor layer. On the other hand, a first word line 202 and a second word line 203 are wired to cover the floating gate electrodes 204 and 205, respectively, to act as the control gate electrodes.

Here in FIG. 2, the source line 206 and the bit line 207 are provided not to overlap the semiconductor active region but may overlap the semiconductor active region. Then, the gap between the source line and the bit line can be further shortened to reduce the memory cell area.

Of course, the upper face structure of the memory cells constructing the nonvolatile memory of the invention is not limited to that of FIG. 2. Any other top face diagram may be adopted with the circuit diagrams of the mode of embodiment and Examples 1 and 2.

Here, the sectional structure (of FIG. 3), as exemplified in the mode of embodiment, can be thought as that relating a segment AB of the upper face structure of the memory cell shown in FIG. 2, for example.

Embodiment 4

In this embodiment, a method for manufacturing a nonvolatile memory of the invention over a substrate having an insulating surface will be described with reference to FIGS. 8A to 8D, 9A to 9D and 10A to 10D. As a TFT constructing the nonvolatile memory, here will be described two memory TFTs (e.g., n-channel TFTs) constructing a memory cell, and two TFTs (e.g., a p-channel TFT and an n-channel TFT) constructing a CMOS circuit representing a drive circuit of the memory cell and another peripheral circuit.

According to the manufacture method to be described, it will be understood that the nonvolatile memory of the invention can be formed integrally with the parts of any semiconductor device that can be manufactured the thin film technique.

On the other hand, the nonvolatile memory of the invention and the semiconductor device provided with the nonvolatile memory are desirably constructed of the TFTs having a semiconductor active layer of excellent crystallinity, but the TFTs having an amorphous semiconductor active film are frequently insufficient. This is because a satisfactory gate insulating film is required from the point of reliability of the nonvolatile memory, because the satisfactory gate insulating film is formed over the excellent semiconductor active layer, and because the TFTs construction the peripheral circuit and other semiconductor parts are demanded for satisfactory characteristics in the mobility and the threshold voltage. The TFTs, as obtained by the manufacture method of this embodiment have the semiconductor active layer of excellent crystallinity and are provided with sufficient performances for constructing the nonvolatile memory and the semiconductor device of the invention.

Figure 8A:
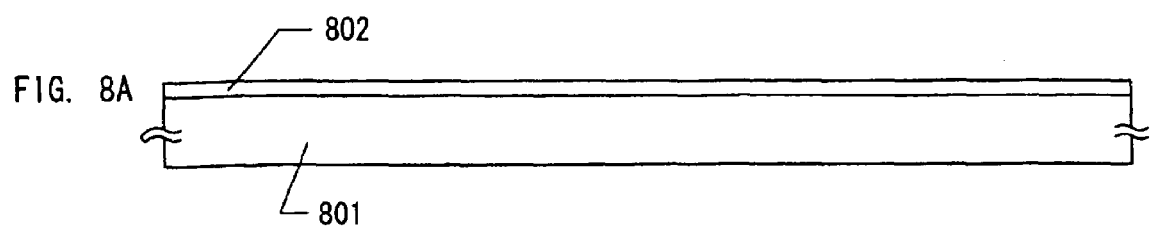
FIGS. 8A to 8D are diagrams showing steps of manufacturing the nonvolatile memory of the invention.
Figure 8B:
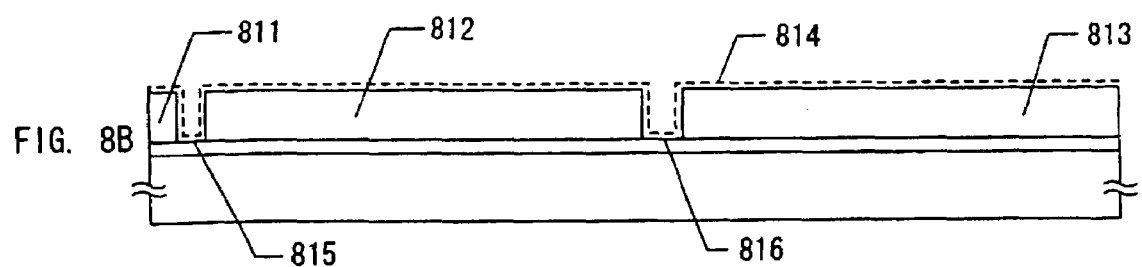

First of all, a quartz substrate 801 is prepared as the substrate having the insulating surface (FIG. 8A). The quartz substrate may be replaced by a quartz substrate having a silicon nitride film as the insulating film, a silicon substrate having a thermally oxidized film, or a ceramic substrate.

Next, an amorphous silicon film 802 having a thickness of 55 mm is formed by the well-known filming method (FIG. 8A). Here, this amorphous silicon film is not limitative but may be an amorphous semiconductor film (e.g., a chemical semiconductor film having an amorphous structure, such as a crystallite semiconductor film or an amorphous silicon germanium film).

Next, the amorphous silicon film 802 is crystallized. For the steps from this to that of FIG. 8C, there can be quoted Japanese Patent Laid-Open No. 10-247735 of the same Applicant, which discloses the technique on the method for crystallizing a semiconductor film by using an element such as Ni as a catalyst.

First of all, there are formed protecting films 811 to 813 (i.e., silicon oxide films having a thickness of 150 nm in this embodiment) which have openings 815 and 816. Over the protecting films 811 to 813, there is formed a layer (as will be called the "Ni-containing layer") 814, which contains nickel (Ni) by the spin-coating method. Here, there may be used the ion injection method utilizing the resist mask, the plasma doping method or the sputtering method.

On the other hand, the catalytic element can be exemplified not only by nickel but also by cobalt (Co), iron (Fe), palladium (Pd), platinum (Pt), copper (Cu), gold (Au), germanium (Ge), lead (Pb) or indium (In).

Figure 8C:
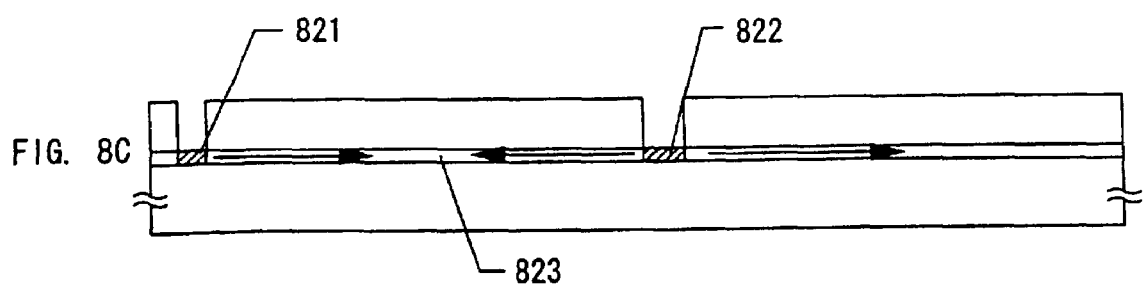

Next, the amorphous silicon film 802 is crystallized by heating it in an inert atmosphere at 570° C. for 14 hours, as shown in FIG. 8C. At this time, the crystallization progresses generally in parallel with the substrate from the starting points of regions (as will be called the "Ni-added regions") 821 and 822, which contact with Ni. A crystalline silicon film 823 thus formed is advantages in its entire crystallinity because the individual crystals are relatively regular. Here, the heat treatment temperature is preferably at 500 to 700° C. (as represented by 550 to 650° C.), and the treatment time period is preferably for 4 to 24 hours.

Figure 8D:
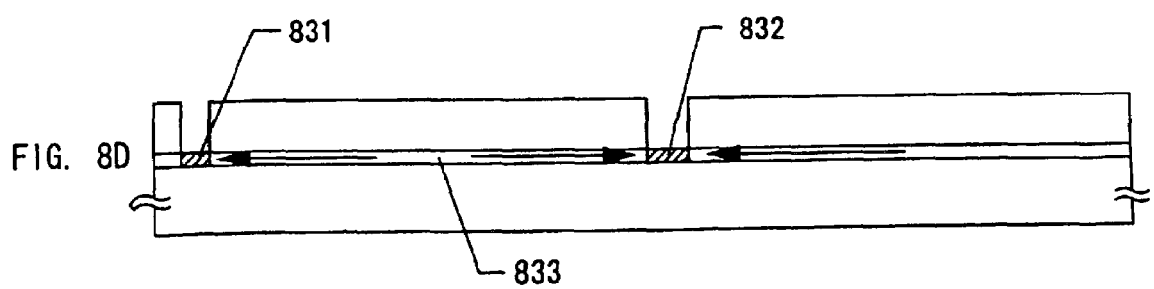

Next, as shown in FIG. 8D, the protecting films 811 to 813 are used as masks to add an element (preferably phosphor) belonging to the 15th group to the Ni-added regions 821 and 822. Thus, there are formed regions (as will be called the "phosphor-added regions") 831 and 832 which are highly doped with phosphor).

As shown in FIG. 8D, moreover, a heat treatment is applied in an inert atmosphere at 600° C. for 12 hours. This heat treatment is exemplified by the gettering step of a metal element (e.g., Ni in this embodiment) with phosphor so that most Ni is finally trapped, as indicated by arrows, in the phosphor-added regions 831 and 832. By this step, the concentration of Ni left in a crystalline silicon film 833 is reduced to at least $2\times10^{17}$ atoms/cm$^3$, as measured by the SIMS (Secondary Ion Mass Spectrography).

Figure 9A:
FIGS. 9A to 9D are diagrams showing steps of manufacturing the nonvolatile memory of the invention.

Thus, there is obtained the crystalline silicon film 833 which has been crystallized by the catalyst, which has been reduced to such a level as not to trouble the action of the TFT. After this, the protecting films 811 to 813 are removed to form island-shaped semiconductor layers (as will be called the "semiconductor active layers") 901 to 903 which contain none of the phosphor-added regions 831 and 832 and which use only the crystalline silicon film 833, by the patterning step (FIG. 9A).

Figure 9B:
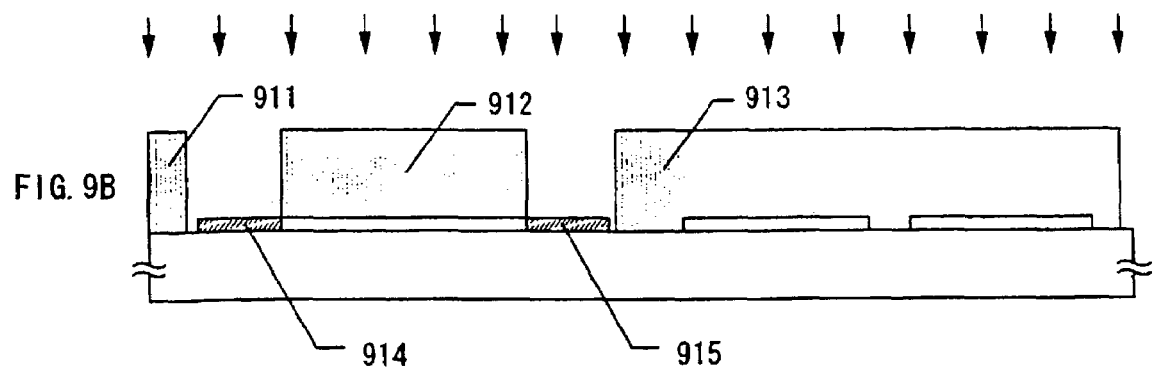

Next, as shown in FIG. 9B, the semiconductor active layer 901 is covered, at its regions excepting the region for forming the overlap region of the memory TFT later and a portion of the region for the source/drain region, with resist masks 911 to 913 so that it is doped with an impurity element (as will be called the "n-type impurity element") for giving the n-type (FIG. 9B). The dosage is so controlled as to dope n-type impurity regions 914 and 915 to be formed at this step, with the n-type impurity element of $1\times10^{20}$ to $1\times10^{21}$ atoms/cm$^3$ (as represented by $2\times10^{20}$ to $5\times10^{20}$ atoms/cm$^3$). The n-type impurity element may be exemplified by phosphor (P) or arsenic (As), and phosphor (P) is used in this embodiment.

Figure 9C:
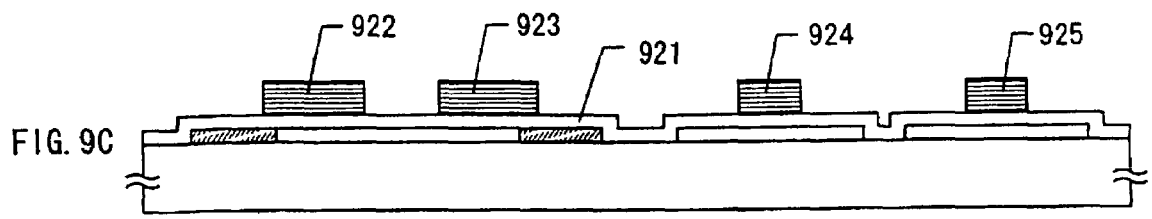

After this, the resist masks 911 to 913 are removed to form a first gate insulating film 921 formed of an insulating film containing silicon (FIG. 9C). The first gate insulating film 921 may be adjusted in its thickness within a range of 10 to 250 nm, while considering the increase at a later thermal oxidation step. Here, the first gate insulating film constructing the memory TFTs may have a thickness of 10 to 50 nm, and the first gate insulating film forming the remaining elements may have a thickness of 50 to 250 nm. On the other hand, the filming method to be used may be the well-known gas phase method (e.g., the plasma CVD method or the sputtering method). In this embodiment, a silicon nitride-oxide film having a thickness of 40 nm is formed by the plasma CVD method.

Next, a thermal oxidation step is performed by applying a heat treatment in the oxidizing atmosphere at 950° C. for 1 hour. At this thermal oxidation step, the oxidation progresses in the interface between the active layer and the aforementioned silicon nitride-oxide film so that the semiconductor active layer takes a thickness of 40 nm finally. Here, the oxidizing atmosphere may be exemplified either by an oxygen atmosphere or by an oxygen atmosphere having a halogen element added thereto. When the thermally oxidized film is thus formed, it is possible to form a semiconductor/insulating film interface having an extremely interface level. It is also effective to prevent the formation failure (or edge thinning) of the thermally oxidized film in the active layer end portions.

Next, a conductive film of 200 to 400 nm is formed and is patterned to form gate electrodes 922 to 925 (FIG. 9C). At this time, the gate electrodes 922 and 923 (as will become the floating gate electrodes later) of the memory TFT are formed to partially overlap the n-type impurity regions 914 and 915 through the gate insulating film 921. This overlap region becomes the overlap region of the memory TFTs.

Here, the gate electrode may be formed of a single-layered conductive film but is preferably formed of a laminated film of two or three layers, if necessary. The gate electrode can be made of the well-known conductive film. This conductive film can be exemplified by: a film made of an element selected from tantalum (Ta), titanium (Ti), molybdenum (Mo), tungsten(W), chromium (Cr) and silicon (Si); a film (as represented by a tantalum nitride film, a tungsten nitride film or a titanium nitride film) made of a nitride of the above-specified elements; an alloy film as represented by Mo—W alloy or Mo—Ta alloy) of a combination of the above-specified elements; or a silicide film (as represented by a tungsten silicide film or a titanium silicide film) of the above-specified elements.

In this embodiment, a laminated film of a tungsten nitride (WN) film of a thickness of 50 nm and a tungsten (W) film of a thickness of 350 nm is formed by the sputtering method. Here, the film peel due to the stress can be prevented, if the inert gas of xenon (Xe) or neon (Ne) is added as the sputtering gas.

Next, there is done a step of adding an impurity element for giving one conductivity. This impurity element may be exemplified for the n-type by phosphor (P) or arsenic (As) and for the p-type by boron (B), gallium (Ga) or indium (In).

Figure 9D:
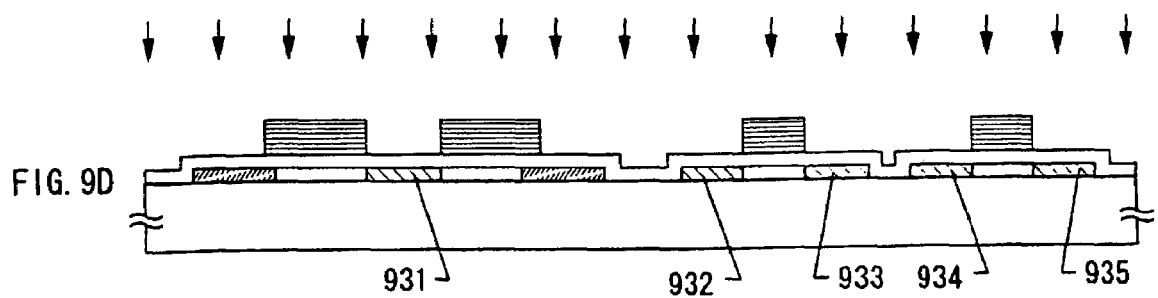

First of all, as shown in FIG. 9D, an n-type impurity element (e.g., phosphor in this embodiment) is added in self-alignment by using the gate electrodes 922 to 925 as the mask, to form lightly doped impurity regions (or n-regions) 931 to 935. These lightly doped impurity regions are adjusted to have a phosphor concentration of $1\times10^{17}$ atoms/cm$^3$ to $1\times10^{19}$ atoms/cm$^3$.

Figure 10A:
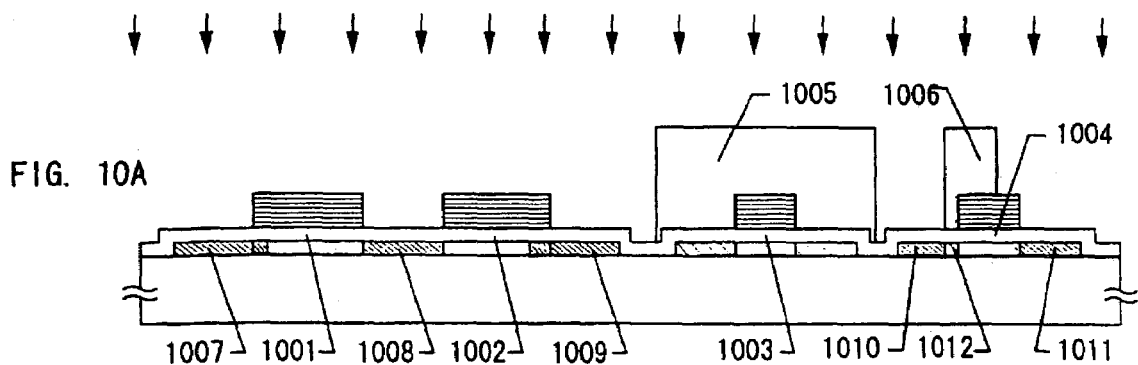
FIGS. 10A to 10D are diagrams showing steps of manufacturing the nonvolatile memory of the invention.

Next, as shown in FIG. 10A, resist masks 1005 and 1006 are formed to cover the p-channel TFT wholly and the n-channel TFT partially, and an n-type impurity element (e.g., phosphor in this embodiment) is added to form impurity regions 1007 to 1011 containing phosphor in a high concentration. At this time, the n-type impurity element is adjusted to have a concentration of $1\times10^{20}$ to $1\times10^{21}$ atoms/cm$^3$ (as represented by $2\times10^{20}$ to $5\times10^{20}$ atoms/cm$^3$).

At this step, there are formed the source/drain regions 1007 and 1009 of the memory TFT, the source/drain regions 1010 and 1011 of the n-channel TFT constructing the CMOS, and an LDD region 1012.

Figure 10B:
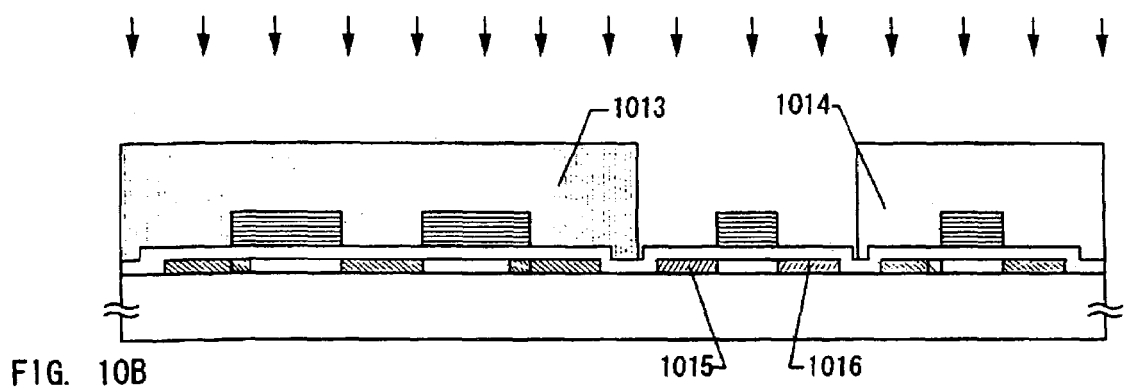

Next, as shown in FIG. 10B, the resist masks 1005 and 1006 are removed to form resist masks 1013 and 1014 newly. Then, a p-type impurity element (e.g., boron in this embodiment) is added to form impurity regions 1015 and 1016 containing boron of a high concentration. Here, the boron is added to give a concentration of $1 \times 10^{20}$ to $1 \times 10^{21}$ atoms/cm$^3$ (as represented by $2 \times 10^{20}$ to $5 \times 10^{20}$ atoms/cm$^3$) by the ion doping method using diborane. Thus, there are formed the source/drain regions 1015 and 1016 of the p-channel TFT (FIG. 10B).

Figure 10C:
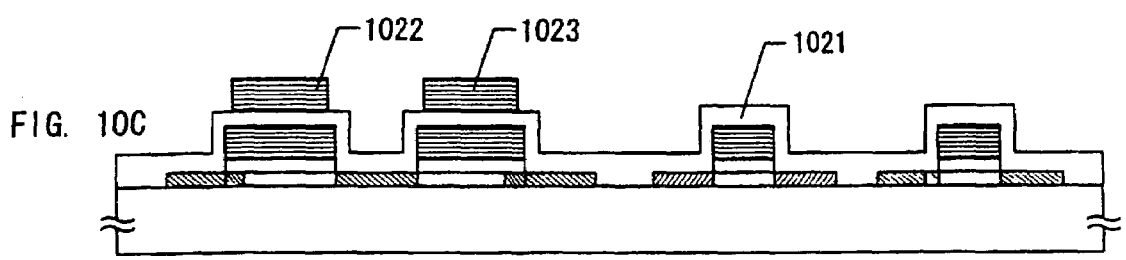

Next, the resist masks 1013 and 1014 are removed, and the gate insulating film 921 is etched by the dry etching method using the gate electrodes 922 to 924 as the masks, to form an insulating film 1021 containing silicon (FIG. 10C). The insulating film 1021 becomes a second insulating film between the floating gate electrode and the control gate electrode in the memory TFT. The insulating film 1021 may have a thickness of 10 to 250 nm. On the other hand, the filming method may be exemplified by the well-known gas phase method (e.g., the plasma CVD method or the sputtering method). Here in this embodiment, a silicon nitride-oxide film of a thickness of 70 nm is formed by the plasma CVD method.

After this, there is activated the n- or p-type impurity element which has been added in its concentration. The activation means may be exemplified by the furnace annealing, laser annealing or ramp annealing method or by their combined methods. In this embodiment, a heat treatment is made in an electric furnace of a nitrogen atmosphere at 550° C. for 4 hours. At this time, on the other hand, the active layer is remedied from the damage which has been received in the adding step.

Next, a conductive film of 200 to 400 nm is formed and is patterned to form control gate electrodes 1022 and 1023 (FIG. 10C). These control gate electrodes 1022 and 1023 are formed to overlap the floating gate electrodes partially or wholly through the insulating film 1021.

Here, the control gate electrodes 1022 and 1023 may be formed of a single-layered conductive film but is preferably formed of a laminated film of two or three layers, if necessary. The gate electrodes can be made of the well-known conductive film. In this embodiment, a laminated film composed of a tungsten nitride (WN) film having a thickness of 50 nm and a tungsten (W) film having a thickness of 350 nm is formed by the sputtering method. When an inert gas such as xenon (Xe) or neon (Ne) is added as the sputtering gas, it is possible to prevent the film peel, as might otherwise be caused by the stress.

Figure 10D:
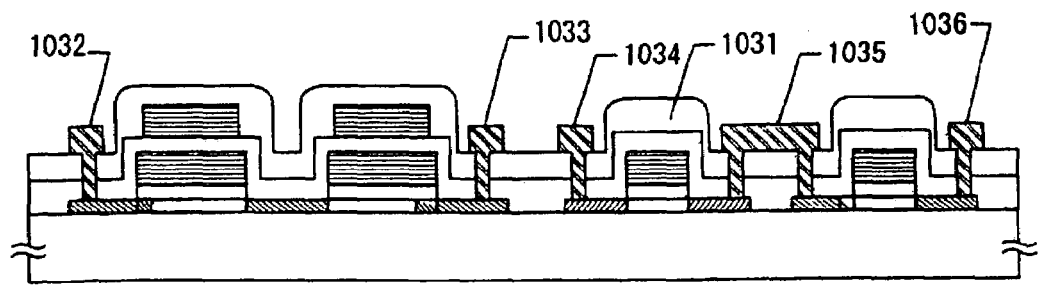

Next, a layer insulating film 1031 is formed (FIG. 10D). This layer insulating film 1031 may be exemplified by an insulating film containing silicon, an organic resin film, or a laminated film combining the former two. On the other hand, the film thickness may be 400 to 1,500 nm. In this embodiment, the insulating film is formed of a silicon nitride-oxide film having a thickness of 500 nm.

Next, as shown in FIG. 10D, for the layer insulating film 1031 and the insulating film 1021, there are formed contact holes and source/drain wiring lines 1032 to 1036. Here in this embodiment, there is formed a laminated film having a three-layered structure in which a Ti film of 100 nm, an aluminum film of 300 nm containing Ti, and a Ti film of 150 nm are continuously formed by the sputtering method. Of course, the conductive film may be another well-known one.

Finally, a heat treatment is made for hydrogenation in an atmosphere containing 3 to 100% of hydrogen at 300 to 450° C. for 1 to 12 hours. This step terminates the unpaired bonding hands of the semiconductor film with the hydrogen which is thermally excited. In this embodiment, the hydrogenation is effected by a heat treatment in the hydrogen atmosphere at 350° C. for 2 hours. Another hydrogenation means may be exemplified by a plasma hydrogenation (using hydrogen excited with a plasma).

By the steps thus far described, it is possible to manufacture the TFT which has the sectional structure shown in FIG. 10D. On the other hand, this embodiment could be combined with any of the constructions of Embodiments 1 to 3 by changing the positions to form the overlap regions, if necessary.

Embodiment 5

The nonvolatile memory of the invention is enabled to provide a small-sized semiconductor device having multiple high functions by forming it integrally with the parts of a semiconductor device which is constructed of TFTs formed over a substrate having an insulating surface. In this embodiment, the semiconductor device is exemplified by an electrooptic device (as represented by a liquid crystal display device and an EL display device), which is provided with a nonvolatile memory of the invention, a pixel portion, a drive circuit for the pixel portion, and a γ (gamma) correction circuit.

The γ-correction circuit is a circuit for the γ-correction. This is a correction for establishing a linear relation between a voltage applied to a pixel electrode and an optical transmission intensity of an overlying liquid crystal or EL layer by adding a proper voltage to an image signal.

Figure 11:
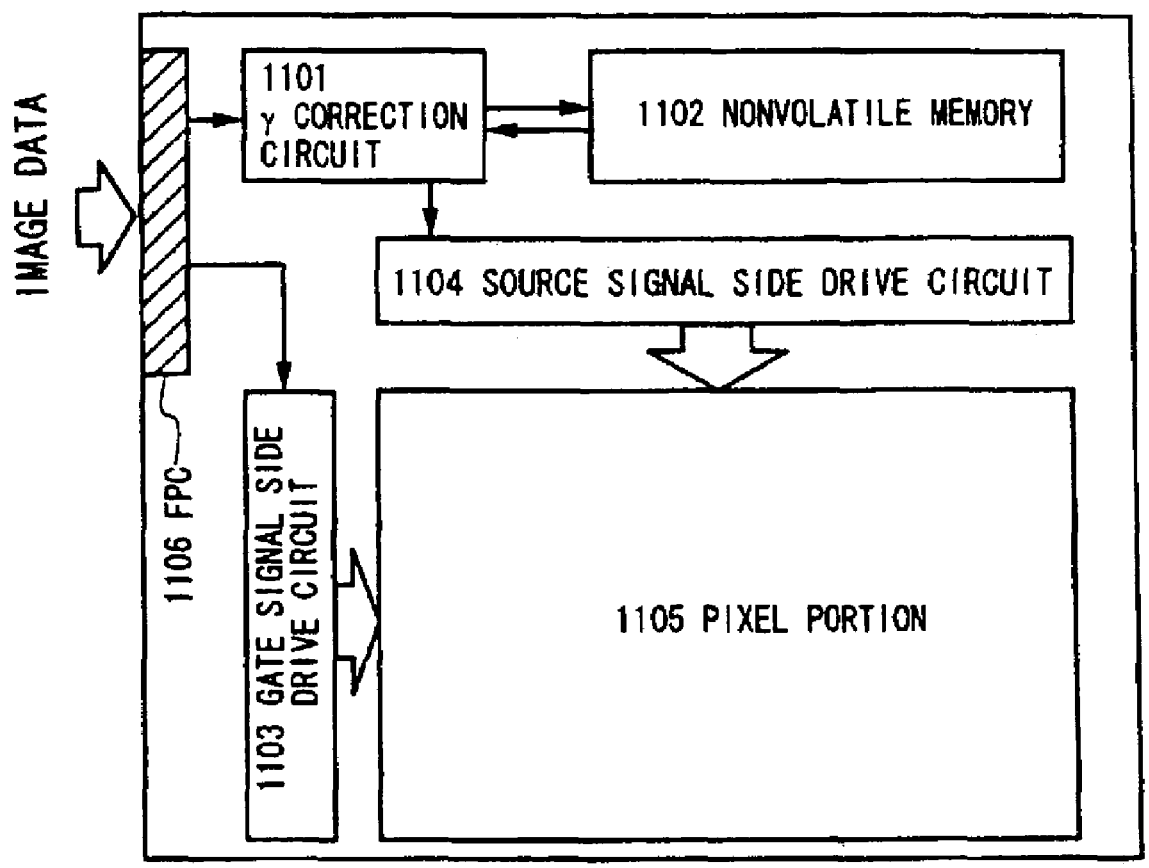
FIG. 11 is a block diagram of an electrooptic device using the nonvolatile memory of the invention.

FIG. 11 is a block diagram of the aforementioned electrooptic device. This electrooptic device is provided with: a nonvolatile memory of the invention; a pixel portion 1105; a gate signal side drive circuit 1103 and a source signal side drive circuit 1104 for driving the pixel portion; and a γ (gamma) correction circuit 1101. On the other hand, an image signal, a clock signal or a synchronizing signal is transmitted via an FPC (Flexible Print Circuit) 1106.

On the other hand, the electrooptic device of this embodiment can be integrally formed over the substrate having the insulating surface by the manufacture method of Embodiment 4, for example. Here, the step after the formation of the TFTs including the formation of the liquid crystal or the EL layer may be exemplified by the well-known method.

On the other hand, the pixel portion 1105, the drive circuits 1103 and 1104 of the pixel portion, and the γ (gamma) correction circuit 1101 may be exemplified by the well-known circuit structures.

In the electrooptic device of this embodiment, the nonvolatile memory 1102 has stored (or memorized) the correction data for γ-correcting the image signal transmitted from the personal computer body or the TV receiving antenna or the like. The γ-correction circuit 1101 γ-corrects the image signal with reference to the correction data.

The data for the γ-correction may be once stored before shipped to the electrooptic device, but the correction data could be periodically rewritten. Even between the electrooptic devices manufactured likewise, on the other hand, the optical response characteristics (e.g., the aforementioned relation between the optical transmission intensity and the applied voltage) of the liquid crystal may be delicately different. In this case, too, γ-correction data different for the individual electrooptic devices can be stored so that an identical image quality can always be obtained.

By storing the nonvolatile memory with a plurality of correction data and by adding a new control circuit, moreover, it is possible to select a plurality of color tones freely on the basis of the correction data.

Here, when the correction data for the γ-correction are to be stored in the nonvolatile memory, it is preferred to use the means disclosed in Japanese Patent Laid-Open No. 11-143379 of the same Applicant. This Laid-Open has also described the γ-correction. Since the correction data to be stored in the nonvolatile memory are digital signals, on the other hand, it is desired to form a D/A converter or an A/D converter, if necessary, over the common substrate.

Here, the construction of this embodiment can be practiced by combining it freely with any of the constructions of Embodiments 1 to 4.

Embodiment 6

An example of the semiconductor device, which is equipped with the nonvolatile memory of the invention but different from that disclosed in Embodiment 5, will be described with reference to FIG. 12.

Figure 12:
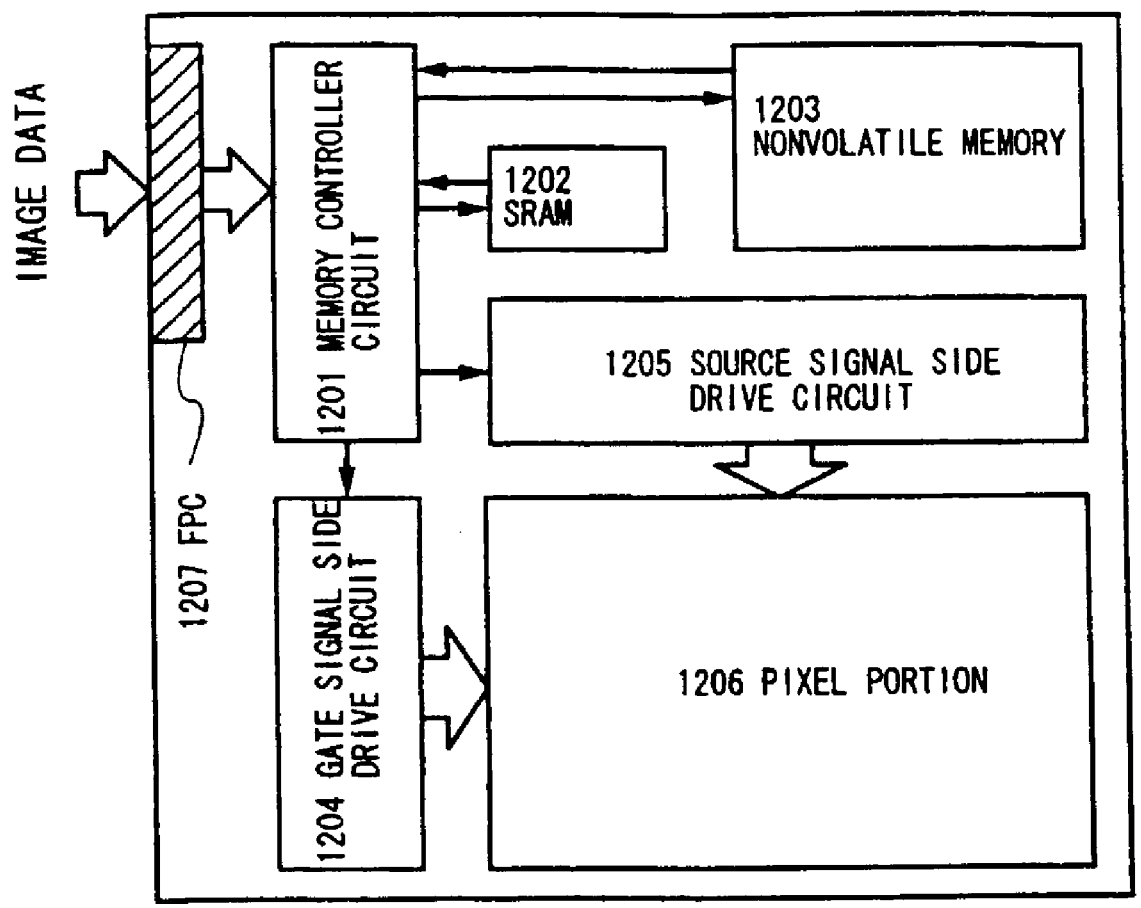
FIG. 12 is a block diagram of an electrooptic device using the nonvolatile memory of the invention.

FIG. 12 is a block diagram showing an electrooptic device (as represented by a liquid crystal display device and an EL display device) of this embodiment. This electrooptic device of the embodiment is provided with a nonvolatile memory 1203 of the invention; a SRAM 1202; a pixel portion 1206; a gate signal side drive circuit 1204 and a source signal side drive circuit 1205 for driving the pixel portion; and a memory controller circuit 1201. On the other hand, an image signal, a clock signal or a synchronizing signal is transmitted via an FPC (Flexible Print Circuit) 1207.

The memory controller circuit 1201 in this embodiment is a control circuit for controlling the operations to store and read the image data in and from the SRAM 1202 and the nonvolatile memory 1203.

The SRAM 1202 is provided for writing data at a high speed. This SRAM may be replaced by a DRAM and may also be omitted if the nonvolatile memory can write at a high speed.

The electrooptic device of this embodiment can be integrally formed over the substrate having the insulating surface, for example, by the manufacture method of Embodiment 4. Here, the step after the formation of the TFTs including the formation of the liquid crystal or the EL layer may be exemplified by the well-known method. On the other hand, the SRAM 1202, the pixel portion 1206, the gate signal side drive circuit 1204, the source signal side drive circuit 1205 and the memory controller circuit 1201 may use the well-known circuit structures.

In the electrooptic device of this embodiment, the image signals, as transmitted from the personal computer body or the TV receiving antenna, are stored (or memorized) for each frame in the SRAM 1202 and are sequentially inputted to and displayed in the display unit 1206 by the memory controller circuit 1201. The SRAM 1202 is stored with at least the image information of one image frame to be displayed in the pixel portion 1206. Where digital signals of 6 bits are transmitted as the image signals, for example, there is required a memory capacity corresponding to at least the pixel number×6 bits. By the memory controller circuit 1201, on the other hand, it is possible, if necessary, to store the image signals in the nonvolatile memory 1203 from the SRAM 1202 and to input and display the image signals from the nonvolatile memory 1203 to and in the pixel portion 1206.

Since the image data to be stored in the SRAM 1202 and the nonvolatile memory 1203 are digital signals, on the other hand, it is desired to form a D/A converter or an A/D converter, if necessary, over the common substrate.

In the construction of this embodiment, the image displayed in the pixel portion 1206 is always stored in the SRAM 1202 so that it can be easily paused. By storing the image signals from the SRAM in the nonvolatile memory 1203 and by inputting the image signals in the nonvolatile memory 1203 to the pixel portion, moreover, the operations to record and reproduce the image can be easily performed. Still moreover, the TV broadcasting can be freely paused, recorded and reproduced without being recorded in the video deck or the like.

The information volume of the image to be recorded and reproduced depends upon the storage capacities of the SRAM 1202 and the nonvolatile memory 1203. A still image can be recorded and reproduced by storing the image signals of at least one frame. If the storage capacity of the nonvolatile memory 1203 can be increased to such an extent as to store the image information of several hundreds or thousands of frames, moreover, it is possible to reproduce (or replay) the image before several seconds or minutes.

Here, the construction of this embodiment can be practiced by combining it freely with any of the constructions of Embodiments 1 to 5.

Embodiment 7

The nonvolatile memory of the invention is enabled to provide a small-sized semiconductor device having multiple high functions by forming it integrally with the parts of a semiconductor device which is constructed of TFTs. The semiconductor device to be formed integrally with the nonvolatile memory of the invention is exemplified by an active matrix type or passive matrix type liquid crystal display device or an active matrix type or passive matrix type EL display device. This embodiment will be described on the active matrix type liquid crystal display device.

Figure 13A:
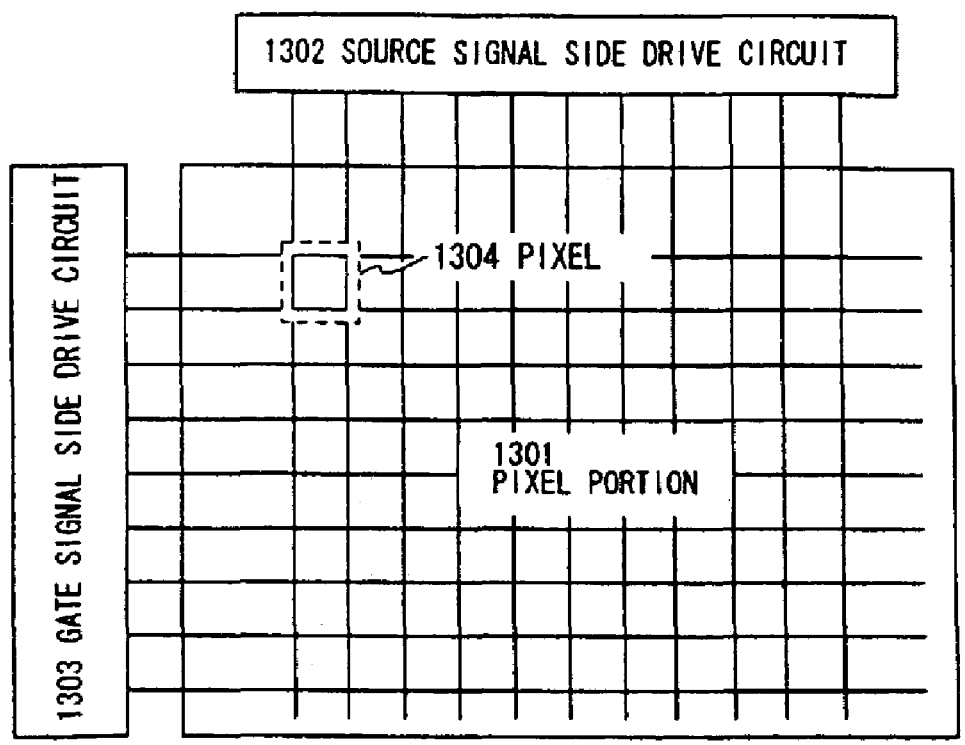
FIGS. 13A and 13B are diagrams showing a construction of an active matrix type liquid crystal display device.

FIG. 13A is a circuit diagram of the active matrix type liquid crystal display device. In FIG. 13A, the active matrix type liquid crystal display device includes: a pixel portion 1301 having pixels 1304 arranged in a matrix shape; a source signal side drive circuit 1302; and a gate signal side drive circuit 1303.

Figure 13B:
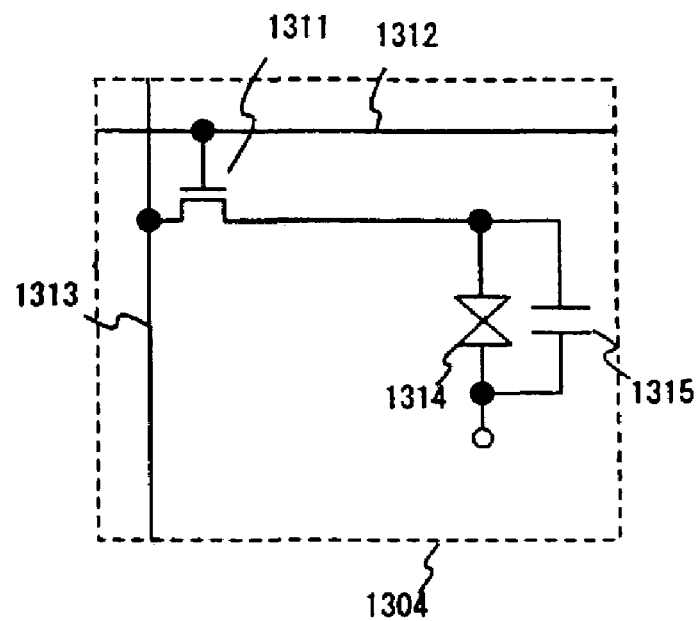

On the other hand, an enlarged diagram of the pixel 1304 composing the pixel portion 1301 is shown in FIG. 13B. The pixel 1304 is composed of a switching TFT 1311, a liquid crystal element 1314 and a capacitor 1315. The switching gate TFT 1311 is connected at its gate electrode with a gate signal line 1312 and at its source electrode or drain electrode with a source signal line 1313. The remaining one of the source electrode and the drain electrode of the switching TFT 1311 is connected with the liquid crystal element 1314 and the capacitor 1315. On the other hand, the liquid crystal element 1314 and the capacitor 1315 are fed at their remaining electrodes with a predetermined potential.

Here, one electrode of the capacitor 1315 may be connected not with a wiring line 1316 but with a dedicated power supply line. Moreover, the capacitor 1315 may be omitted. On the other hand, the switching TFT 1311 may be either an n-channel TFT or a p-channel TFT.

Where the nonvolatile memory of the invention is formed integrally with the active matrix liquid crystal display device of this embodiment, it may be combined with any of the constructions of Embodiments 1 to 6.

Embodiment 8

This embodiment will be described on an active matrix type EL display device as an example of the semiconductor device which is formed integrated with the nonvolatile memory of the invention.

Figure 14A:
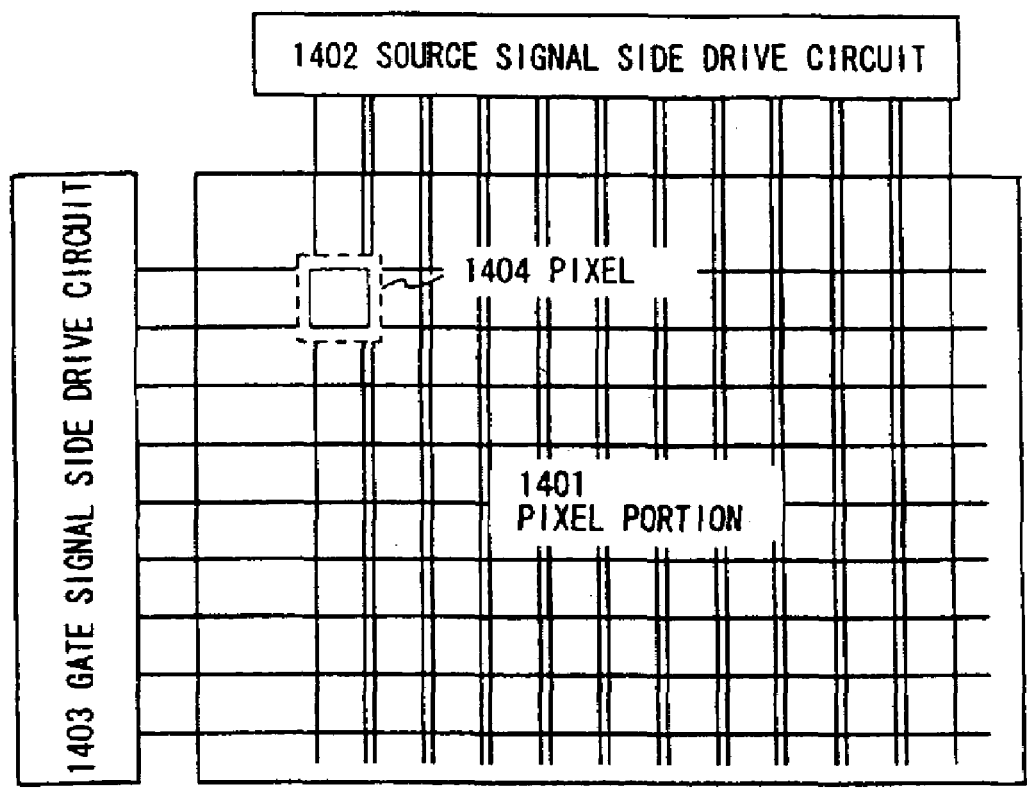
FIGS. 14A and 14B are diagrams showing a construction of an active matrix type EL display device.

FIG. 14A is a circuit diagram showing the active matrix type EL display device. In FIG. 14A, the active matrix type EL display device includes: a pixel portion 1401 having pixels 1404 arranged in a matrix shape; a source signal side drive circuit 1402; and a gate signal side drive circuit 1403.

Figure 14B:
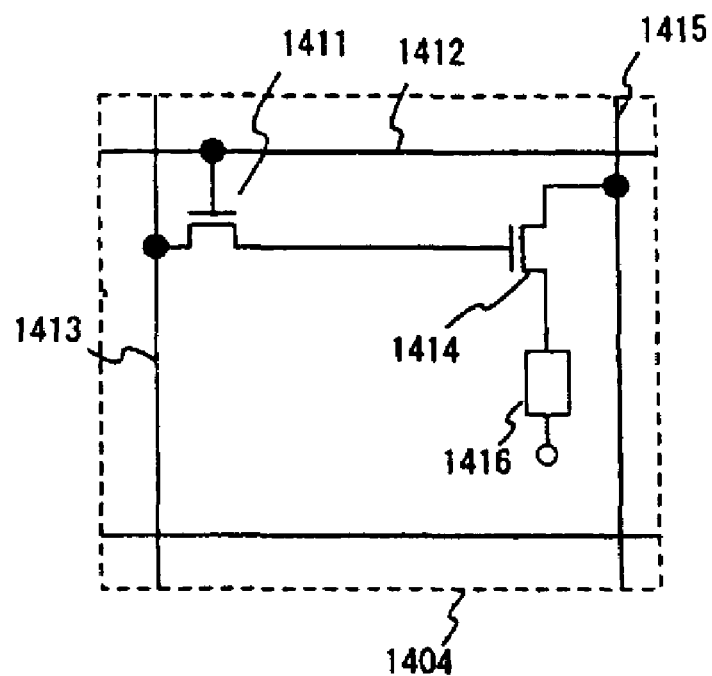

On the other hand, an enlarged diagram of the pixel 1404 composing the pixel portion 1401 is shown in FIG. 14B. The pixel 1404 is composed of a switching TFT 1411, an EL driving TFT 1414 and an EL element 1416. The switching gate TFT 1411 is connected at its gate electrode with a gate signal line 1412 and at its source electrode or drain electrode with a source signal line 1413. The remaining one of the source electrode and the drain electrode of the switching TFT 1411 is connected with the gate electrode of the EL driving TFT 1414. On the other hand, the EL driving TFT element 1416 is connected at its source electrode with a power supply line 1415 and at its drain electrode with the EL element 1416. The EL element 1416 is fed at its remaining electrode with a predetermined potential.

Here, a capacitor may be connected between the gate electrode of the EL driving TFT 1414 and the power supply line 1415. On the other hand, the EL driving TFT is exemplified by a n-channel TFT. The switching TFT 1411 may be either an n-channel TFT or a p-channel TFT.

Where the nonvolatile memory of the invention is formed integrally with the active matrix liquid crystal display device of this embodiment, it may be combined with any of the constructions of Embodiments 1 to 6.

Embodiment 9

The nonvolatile memory of the invention has a variety of applications. This embodiment will be described on electronic devices using the nonvolatile memory of the invention.

As these electronic devices, there can be enumerated a video camera, a digital camera, a projector (of rear type or front type), a head-mountable display, a goggle type display, a game machine, a car navigation, a personal computer, and a mobile information terminal (e.g., a mobile computer, a mobile telephone or an electronic book), as shown in FIGS. 15A to 15F and FIGS. 16A and 16B.

Figure 15A:
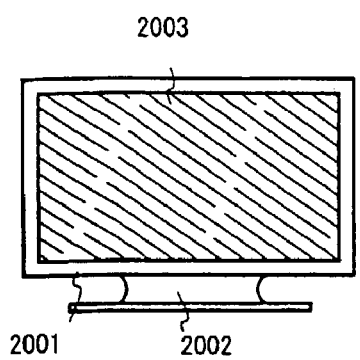
FIGS. 15A to 15F show electronic devices using the nonvolatile memory of the invention.

FIG. 15A shows a display including a casing 2001, a support pedestal 2002 and a display unit 2003. The nonvolatile memory of the invention may be formed integrally with the display unit 2003 of another signal control circuit.

Figure 15B:
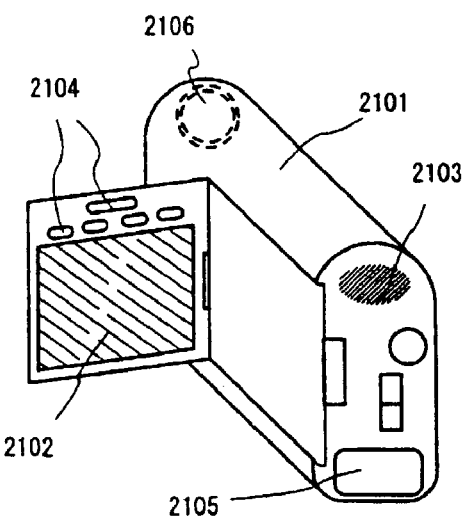
Figure 15C:
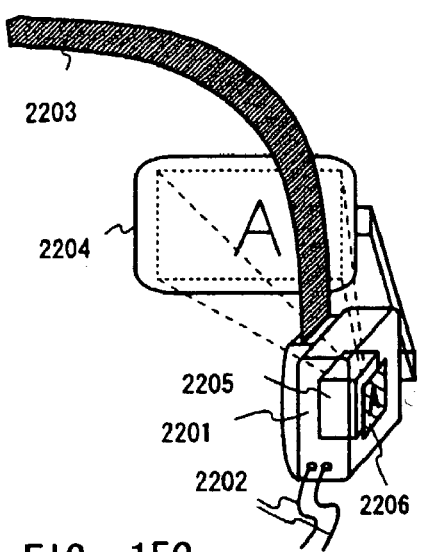

FIG. 15B shows a video camera including a body 2101, a display unit 2102, a voice input unit 2103, manipulation switches 2104, a battery 2105 and an image receiving unit 2106. The nonvolatile memory of the invention may be formed integrally with the display unit 2102 or another signal control circuit.

FIG. 16C shows one portion (i.e., a righthand side) of a head-mounted display including a body 2201, a signal cable 2202, a head fixing band 2203, a display unit 2204, an optical system 2205 and a display device 2206. The nonvolatile memory of the invention may be formed integrally with the display unit 2206 or another signal control circuit.

Figure 15D:
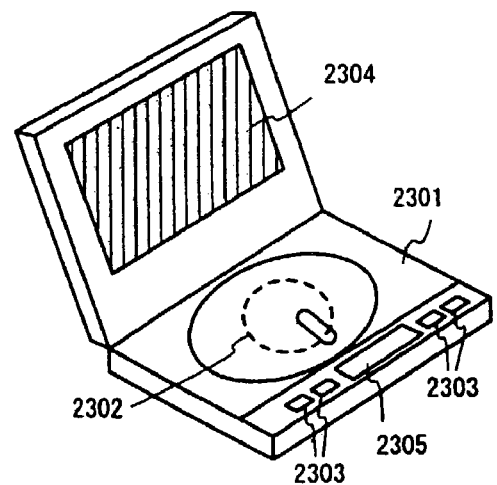

FIG. 15D shows an image reproducing device (e.g., a DVD reproducing device) provided with a recording medium. The image reproducing device includes a body 2301, a recording medium 2302, manipulation switches 2303 and display units 2304 and 2305. Here, this device is enabled to enjoy music, movies, games or Internet by using the DVD (Digital Versatile Disc) or DC as the recording medium. The nonvolatile memory of the invention may be formed integrally with the display unit 2304 or another signal control circuit.

Figure 15E:
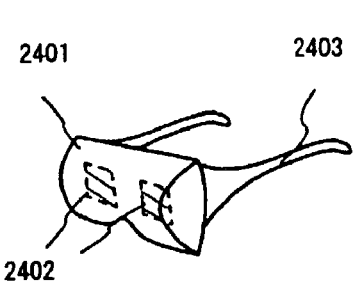

FIG. 15E shows a goggle type display including a body 2401, a display unit 2402 and arm portions 2403. The nonvolatile memory of the invention may be formed integrally with the display unit 2402 or another signal control circuit.

Figure 15F:
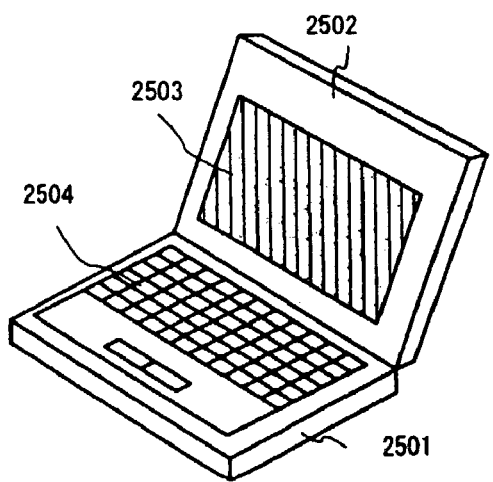

FIG. 15F shows a personal computer including a body 2501, a casing 2502, a display unit 2503 and a keyboard 2504. The nonvolatile memory of the invention may be formed integrally with the display unit 2503 or another signal control circuit.

Figure 16A:
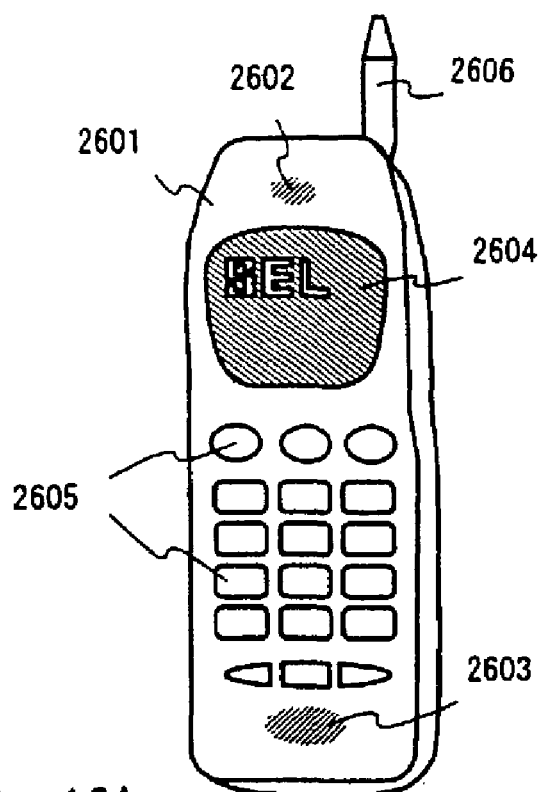
FIGS. 16A and 16B show electronic devices using the nonvolatile memory of the invention.

FIG. 16A shows a mobile telephone including a body 2601 a voice output unit 2602, a voice input unit 2603, a display unit 2604, manipulation switches 2605 and an antenna 2606. The nonvolatile memory of the invention may be formed integrally with the display unit 2604 or another signal control circuit.

Figure 16B:
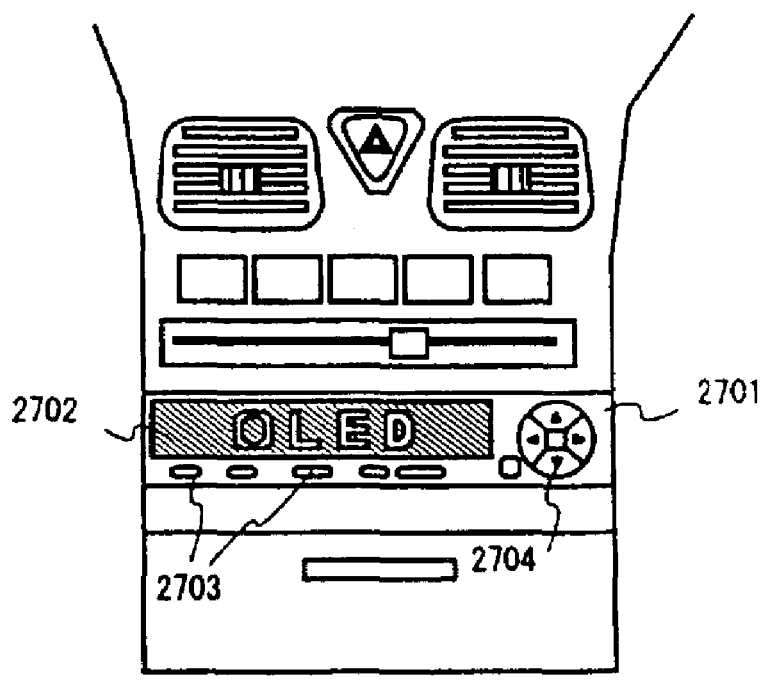

FIG. 16B shows an acoustic reproduction device, as exemplified by a car audio including a body 2701, a display unit 2702 and manipulation switches 2703 and 2704. The nonvolatile memory of the invention may be formed integrally with the display unit 2702 or another signal control circuit. On the other hand, this embodiment is exemplified by the car audio but may be exemplified by a mobile type or home audio device.

As has been described hereinbefore, the invention can have an extremely wide range of applications and can be applied to electronic devices of any fields. On the other hand, the electronic device of this embodiment can be realized by using a construction of any of the combinations of Embodiments 1 to 8.

In the nonvolatile memory of the invention, the memory cell is composed of two memory transistors so that the nonvolatile memory can realize a memory capacity of two times as large for a memory area as that of the full-function EEPROM of the prior art, in which the memory cell is composed of one memory transistor and one selection transistor, while retaining functions similar to those of the EEPROM.

As a result, it is possible to provide a small-sized full-function EEPROM of a high integration density at a low cost.

On the other hand, a small-sized semiconductor device of high functions or multiple functions can be realized by forming the nonvolatile memory of the invention integrally with another semiconductor part over a substrate having an insulating surface.

What is claimed is:

1. A nonvolatile memory comprising:
   a memory cell array having memory cells arranged in a matrix shape; and
   a plurality of driving circuits for the memory cells,
   wherein each of said memory cells has a plurality of memory transistors connected in series, and
   wherein the plurality of memory transistors are a same conductive type.

2. A memory according to claim 1, wherein said nonvolatile memory is be written at each 1 bit and erased at each 1 bit.

3. A memory according to claim 1, wherein said memory cells are written and erased with a tunnel current.

4. A memory according to claim 1, wherein the memory transistors in said memory cells are n-channel transistors.

5. A memory according to claim 1, wherein the memory transistors in said memory cells are p-channel transistors.

6. A memory according to claim 1, wherein said memory cell array and the driving circuits are integrally formed over a substrate having an insulating surface.

7. A nonvolatile memory comprising:
a memory cell array having memory cells arranged in a matrix, each of said cells comprising a plurality of memory transistors connected in series;
a plurality of driving circuits for the memory cells;
a plurality of word lines, one of said word lines connected to a gate electrode of one of said memory transistors;
a plurality of bit lines, one of said bit lines connected to one of a source electrode and a drain electrode of the one of said memory transistors; and
a plurality of source lines, one of said source lines connected to one of a source electrode and a drain electrode of another one of said memory transistors.

8. A memory according to claim 7, wherein said nonvolatile memory can is written at each 1 bit and erased at each 1 bit.

9. A memory according to claim 7, wherein said memory cells are written and erased with a tunnel current.

10. A memory according to claim 7, wherein the source line and the bit line, which are to be connected with the memory cells to be written, are at the same potential at the writing time.

11. A memory according to claim 7, wherein each of said memory transistors includes a source region, a drain region, a channel forming region, a first gate insulating film, a floating gate electrode, a second gate insulating film and a control gate electrode, and
wherein said floating gate electrode partially overlaps with at lease one of said source region and said drain region through said first gate insulating film.

12. A memory according to claim 7, wherein the memory transistors in said memory cells are n-channel transistors.

13. A memory according to claim 7, wherein the memory transistors in said memory cells are p-channel transistors.

14. A memory according to claim 7, wherein said memory cell array and said driving circuits are integrally formed over a substrate having an insulating surface.

15. A semiconductor device comprising:
a pixel portion having a plurality of pixels arranged in a matrix shape over a substrate;
a pixel driving circuit comprising TFTs for driving said plurality of pixels; and
a nonvolatile memory comprising:
a memory cell array having memory cells arranged in a matrix shape; and
a plurality of driving circuits for the memory cells,
wherein each of said memory cells has a plurality of memory transistors connected in series,
wherein said pixel portion, said pixel driving circuit, and said nonvolatile memory are integrally formed over said substrate.

16. A device according to claim 15, wherein said nonvolatile memory is be written at each 1 bit and erased at each 1 bit.

17. A device according to claim 15, wherein said memory cells are written and erased with a tunnel current.

18. A device according to claim 15, wherein the memory transistors in said memory cells are n-channel transistors.

19. A device according to claim 15, wherein the memory transistors in said memory cells are p-channel transistors.

20. A device according to claim 15, wherein said semiconductor device is a liquid crystal display device.

21. A device according to claim 15, wherein said semiconductor device is an EL display device.

22. A device according to claim 15, wherein said semiconductor device is selected from the group consisting of a display, a video camera, a DVD player, a head-mounted display, a personal computer, a mobile telephone and a car audio.

23. A semiconductor device comprising:
a pixel portion having a plurality of pixels arranged in a matrix shape over a substrate;
a pixel driving circuit composed of TFTs for driving said plurality of pixels; and
a nonvolatile memory comprising:
a memory cell array having memory cells arranged in a matrix, each of said memory cells comprising a plurality of memory transistors connected in series;
a plurality of driving circuits for the memory cells;
a plurality of word lines, one of said word lines connected to a gate electrode of one of said memory transistors;
a plurality of bit lines, one of said bit lines connected to one of a source electrode and a drain electrode of the one of said memory transistors; and
a plurality of source lines, one of said source lines connected to one of a source electrode and a drain electrode of another one of said memory transistors,
wherein said pixel portion, said pixel driving circuit and said nonvolatile memory are integrally formed over said substrate.

24. A memory according to claim 23, wherein said nonvolatile memory can is written at each 1 bit and erased at each 1 bit.

25. A memory according to claim 23, wherein said memory cells are written and erased with a tunnel current.

26. A memory according to claim 23, wherein the source line and the bit line, which arc to be connected with the memory cells to be written, are at the same potential at the writing time.

27. A memory according to claim 23, wherein each of said memory transistors includes a source region, a drain region, a channel forming region, a first gate insulating film, a floating gate electrode, a second gate insulating film and a control gate electrode, and
wherein said floating gate electrode partially overlaps with at lease one of said source region and said drain region through said first gate insulating film.

28. A device according to claim 23, wherein the memory transistors in said memory cells are n-channel transistors.

29. A device according to claim 23, wherein the memory transistors in said memory cells arc p-channel transistors.

30. A device according to claim 23, wherein said semiconductor device is a liquid crystal display device.

31. A device according to claim 23, wherein said semiconductor device is an EL display device.

32. A device according to claim 23, wherein said semiconductor device is selected from the group consisting of a display, a video camera, a DVD player, a head-mounted display, a personal computer, a mobile telephone and a car audio.

33. A device according to claim 1, wherein each of said memory transistors comprises a floating gate electrode and a control gate electrode.

34. A device according to claim 33, wherein said floating gate electrode partially overlaps with one of a source region and a drain region in the each of the memory transistors.

35. A memory according to claim 1, wherein said memory cell array and the driving circuits are integrally formed over an SOI substrate.

36. A memory according to claim 7, wherein said memory cell array and the driving circuits are integrally formed over an SOI substrate.

37. A memory according to claim 7, wherein said source lines are connected to one of the driving circuits.

38. A device according to claim 15, wherein each of said memory transistors comprises a floating gate electrode and a control gate electrode.

39. A device according to claim 38, wherein said floating gate electrode partially overlaps with one of a source region and a drain region in the each of the memory transistors.

40. A device according to claim 15, wherein said substrate has an insulating surface.

41. A device according to claim 15, wherein said substrate is an SOI substrate.

42. A device according to claim 23, wherein said substrate has an insulating surface.

43. A device according to claim 23, wherein said substrate is an SOI substrate.

44. A device according to claim 23, wherein said source lines are connected to one of the driving circuits in the nonvolatile memory.

45. A nonvolatile memory comprising:
a memory cell array having memory cells arranged in a matrix shape; and
a plurality of driving circuits for the memory cells,
wherein each of said memory cells has a plurality of memory transistors connected in series, and
wherein each of said plurality of memory-transistors comprises at least a semiconductor active layer formed on an insulating surface.

46. A memory according to claim 45, wherein said nonvolatile memory is be Written at each 1 bit and erased at each 1 bit.

47. A memory according to claim 45, wherein said memory cells are written and erased with a tunnel current.

48. A memory according to claim 45, wherein the memory transistors in said memory cells are n-channel transistors.

49. A memory according to claim 45, wherein the memory transistors in said memory cells are p-channel resistors.

50. A memory according to claim 1, wherein said memory cell array and the driving circuits are integrally formed over a substrate having the insulating surface.

51. A nonvolatile memory comprising:
a memory cell array having memory cells arranged in a matrix, each of said cells comprising a plurality of memory transistors connected in series;
a plurality of driving circuits for the memory cells;
a plurality of word lines, one of said word lines connected to a gate electrode of one of said memory transistors;
a plurality of bit lines, one of said bit lines connected to one of a source electrode and a drain electrode of the one of said memory transistors; and
a plurality of source lines, one of said source lines connected to one of a source electrode and a drain electrode of another one of said memory transistors,
wherein each of said plurality of memory transistors comprises at least a semiconductor active layer formed on an insulating surface.

52. A memory according to claim 51, wherein said nonvolatile memory is written at each 1 bit and erased at each 1 bit.

53. A memory according to claim 51, wherein said memory cells are written and erased with a tunnel current.

54. A memory according to claim 51, wherein the source line and the bit line, which are to be connected with the memory cells to be written, are at the same potential at the writing time.

55. A memory according to claim 51, wherein each of said memory transistors includes a source region, a drain region, a channel forming region, a first gate insulating film, a floating gate electrode, a second gate insulating film and a control gate electrode, and
wherein said floating gate electrode partially overlaps with at lease one of said source region and said drain region through said first gate insulating film.

56. A memory according to claim 51, wherein the memory transistors in said memory cells are n-channel transistors.

57. A memory according to claim 51, wherein the memory transistors in said memory cells are p-channel transistors.

58. A memory according to claim 51, wherein said memory cell array and said driving circuits are integrally formed over a substrate having the insulating surface.

* * * * *